United States Patent [19]
Patel

[11] Patent Number: 5,546,562
[45] Date of Patent: Aug. 13, 1996

[54] METHOD AND APPARATUS TO EMULATE VLSI CIRCUITS WITHIN A LOGIC SIMULATOR

[76] Inventor: Chandresh Patel, 3480 Granada Ave., #249, Santa Clara, Calif. 95051

[21] Appl. No.: 395,324

[22] Filed: Feb. 28, 1995

[51] Int. Cl.$^6$ ................................. G06F 3/00; G06G 7/48
[52] U.S. Cl. .................... 395/500; 364/578; 364/DIG. 1; 364/488; 395/183.09; 395/183.04
[58] Field of Search ........................... 364/578, 488–491, 364/579, DIG. 1, DIG. 2, 221.2, 264.3, 916, 132, 243, 232.3, 232.8; 395/500, 157, 800, 325, 183.04, 183.06, 183.09, 183.05, 183.08, 700; 371/22.4, 22.1, 25.1, 27, 23, 22.3, 29.1, 16.1

[56] References Cited

U.S. PATENT DOCUMENTS

| | | | |
|---|---|---|---|
| 4,306,286 | 12/1981 | Cocke et al. | 395/800 |
| 4,590,581 | 5/1986 | Niddoes et al. | 364/578 |
| 4,633,417 | 12/1986 | Wilburn et al. | 364/550 |
| 4,635,218 | 1/1987 | Widdoes, Jr. | 364/578 |
| 4,644,487 | 2/1987 | Smith | 364/578 |
| 4,656,580 | 4/1987 | Hitchcock, Sr. et al. | |
| 4,782,461 | 11/1988 | Mick et al. | 364/900 |
| 4,891,773 | 1/1990 | Ooe et al. | 364/578 |
| 4,901,259 | 2/1990 | Watkins | 364/578 |
| 4,907,180 | 3/1990 | Smith | 364/578 |

(List continued on next page.)

OTHER PUBLICATIONS

"Hardware Modeling: The Real Stuff's Role in System Simulation" by Milt Leonard, (Electronic Products, Apr. 15, 1987).

"Simulation Verifies System Designs Faster" by Michael Turner Allan Zacharda (Computer System Design May, 1987).

(List continued on next page.)

*Primary Examiner*—Kevin J. Teska
*Assistant Examiner*—Jacques H. Louis-Jacques

[57] ABSTRACT

An emulation modeling apparatus (54) comprises a combination of a device under simulation (48) to be emulated and means for keeping the device under simulation (48) in a quiescent state at normal operating speeds and in a normal operating sequence so as to allow dual access to the emulation modeling apparatus (54) without loss of data or accuracy of functions. One access is from a host simulation environment (26) while the other is from a model debug user interface (20) where internal architecturally visible registers and status are available to the user for greater debug control on the simulated subsystem within simulation environment (26). Specifically, any of a wide variety of physical VLSI circuits (48) to be modeled is kept in a quiescent state after power-on by a device control (50). It is then accessed through simulation means by simulated subsystem within a simulation environment (26), to change the architecturally visible internal state of the VLSI circuit (48). Control (50) brings VLSI circuit (48) out of the quiescent state and submits the requested simulated access. After taking the response, control (50) returns VLSI circuit (48) again to its quiescent state so as to keep its internal state current. The response is sent back to simulation environment (26) to update the simulated subsystem. Independently, any user request for accessing the architecturally visible internal state of the circuit is gathered by model debug and user interface (20). Interface (20) enables control (50) to bring VLSI circuit (48) out of the quiescent state and to submit the user request access. Subsequently, control (50) monitors the response and returns VLSI circuit (48) to its quiescent state so as to maintain the internal state of VLSI circuit (48) current. Control (50) then sends the response back to user interface (20). VLSI circuit (48) thus is always kept ready and current for the next request, either from simulation environment (26) or from user interface (20) without having to reset it. If any user defined breakpoint condition is met during the simulated accesses on the VLSI circuit (48), this information is forwarded by control (50) to simulation environment (26) for stopping the simulation and to user interface (20) to update the debug screen accordingly.

15 Claims, 11 Drawing Sheets

U.S. PATENT DOCUMENTS

| | | | |
|---|---|---|---|
| 5,053,980 | 10/1991 | Kanazawa | 364/578 |
| 5,146,460 | 9/1992 | Ackerman et al. | 364/578 |
| 5,325,309 | 6/1994 | Halaviati et al. | 364/578 |
| 5,327,361 | 7/1994 | Long et al. | 364/578 |
| 5,329,471 | 7/1994 | Swoboda et al. | 364/578 |
| 5,339,262 | 8/1994 | Rostoker et al. | 364/578 |
| 5,353,243 | 10/1994 | Read et al. | 364/578 |
| 5,475,832 | 12/1995 | Shoji et al. | 395/500 |

OTHER PUBLICATIONS

"Board–Level Simulation Using Models With X–State Handling" William D. Billowitch (VLSI Systems Design, Feb. 1987).

"Hardware Modeler Spans Multiple Environments" Norman F. Kelly et al. (High Performance Systems Apr. 1989).

"Hardware—Software Co–Design and ESDA" Kurt Keutzer (31st Design Automation Conference Proceeding 1994).

"Hardware/Software Co–Simulation" James A. Rowson (31st Design Automation Conference Proceedings 1994).

"Bridging The Gap To Software" Steven E. Schulz (ASIC and EDA Magazine, Sep. 1994).

"The Softening of Hardware in Embedded Systems Design" Robert L. Hoffman (Electronic Design, Oct. 3, 1994 Software Engineering).

"Query: To Simulate or to Emulate?" John Fogelin (Electronic Engineering Times Sep. 1994).

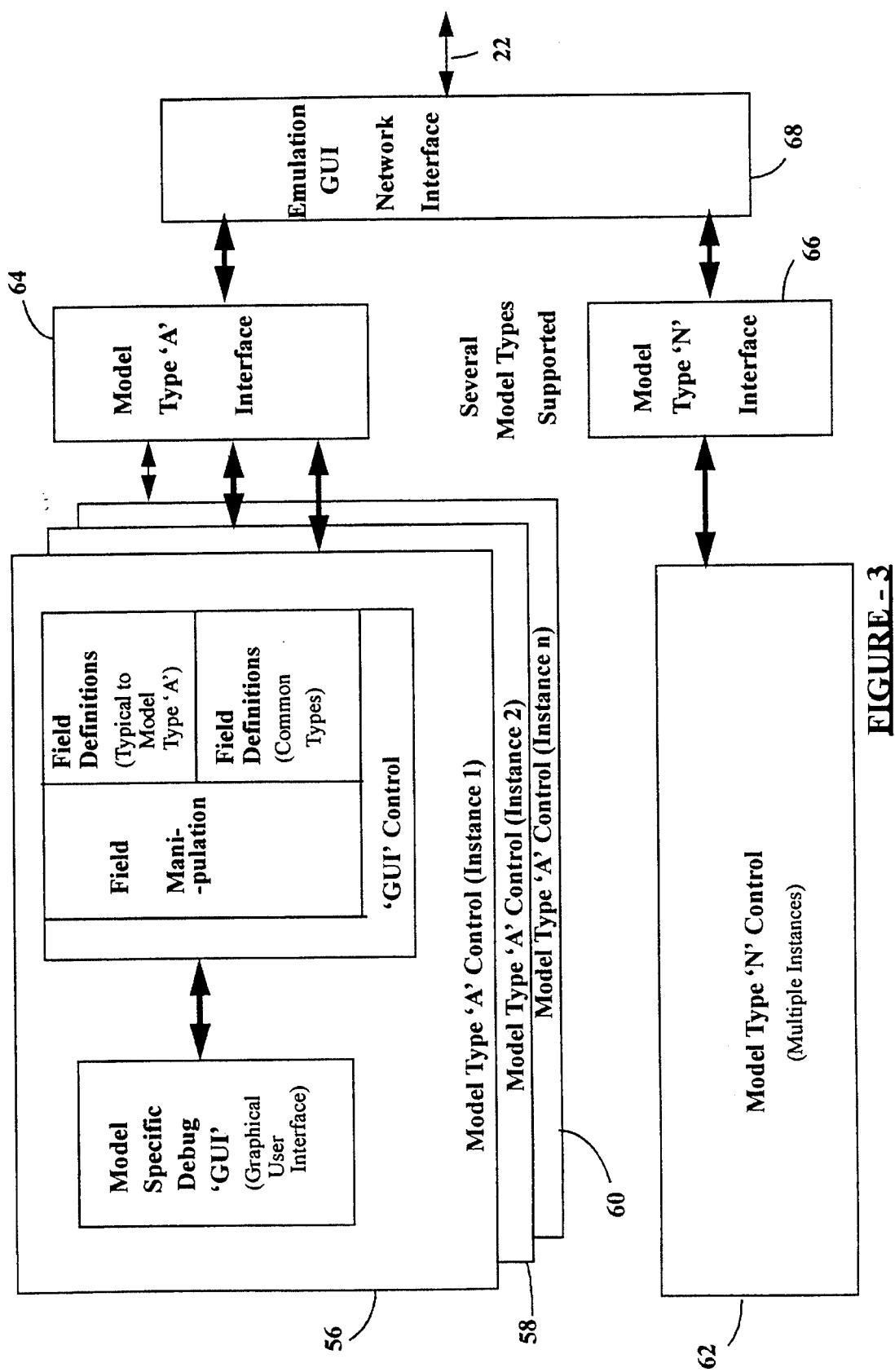

METHOD AND APPARATUS TO EMULATE VLSI CIRCUITS WITHIN A LOGIC SIMULATOR

BACKGROUND—FIELD OF INVENTION

This invention relates to simulation, modeling, and control of operations of complex large scale integration (LSI) devices, very large scale integration (VLSI) digital devices, or digital systems. More specifically, the invention relates to controllability and observability of complex digital circuitry and systems within logic simulation sessions, including those capable of executing instructions under program control.

BACKGROUND—DESCRIPTION OF PRIOR ART

Traditionally, any design team which used digital logic simulators (computer software systems to verify, digital hardware designs) had access to only software-based logic simulation models to exercise and to verify the simulated design. These logic simulation models are software programs which emulate the functionality of devices used in the simulated design on the logic simulators. For simple digital devices, even today, software simulation models are very much in use, while software simulation models of complex VLSI integrated circuits are being developed less often due to a few disadvantages. For one, they are very time consuming to develop and test. Second, for a third party (a party other than the manufacturers or customer) to develop the software model for a complex device with accuracy, the specifications of the internal operation of the device must be gathered and thoroughly understood. This has been a serious limitation because manufacturers of such complex devices are generally reluctant to disclose such details to third parties.

U.S. Pat. No. 4,590,581 to L. Curtis Widdoes, Jr., May 20, 1986, "Method and Apparatus for Modeling Systems of Complex Circuits", discloses a hardware modeler for simulating a VLSI device with an actual physical specimen of such device. While Widdoes' apparatus provides functional accuracy of the device during simulation, the modeling method results in a very poor simulation performance and it does not provide observability of the internal operation of the device being simulated. These are major deficiencies of Widdoes' system. Therefore the design and debugging of digital systems still leaves much to be desired. Specifically, performance is of particular concern for a device which needs a constant application of clock and other functional signals to keep it operating properly, as do most microprocessors and memory devices. For such devices, the hardware modeler must repeat all previously simulated input signals before a new set of stimuli is applied. The implication of this fact is that the time to execute a set of test stimuli to simulate a digital design using a hardware model is proportional to the square of the number of test stimuli in the set. Typically, finite pattern memories of the hardware modeler (storage of previously replayed simulation signals) seriously limit the number of test stimuli sets that can be applied within a typical simulation session.

Although Widdoes cites software model performance as one of the drawbacks of a complex software model, it is generally agreed now that the software models for microprocessors fare equally well in simulation performance against a hardware model for the same microprocessor. When multiple representations (instances) of a device are used in a simulation session, or several users need to access the same hardware model as outlined in Widdoes' patent, the performance of the overall logic simulation is drastically reduced when using the hardware modeler. This is due to the fact that a complete history of the simulation pattern for each instance (different representation of a VLSI device used within a design) has to be repeatedly replayed to the actual device. These performance degradations and test pattern quantity limitations are not there when using software models for same devices. Finally, the apparatus and means described by Widdoes to build a hardware modeler needs complicated hardware and fast access memories and is thus very expensive.

The hardware modeler had subsequently been improved with Widdoes' improvement U.S. Pat. No. 4,635,218, granted Jan. 6, 1987 which shows an apparatus which alleviates certain limitations of pattern memory and model performance. This only partially improved the drawbacks outlined above. While the altered method provided a slight increase on the memory pattern capacity and reduced slightly the network traffic overhead of communication between the simulator and the hardware modeler, it did little to reduce the costly hardware to control these activities. This Widdoes U.S. Pat. No. 4,635,218 patent ended up providing a hardware model capable of providing only logic and timing accuracy of the actual physical device being simulated, but it compromised one fundamental characteristic which a complex simulation model needs mainly to support, i.e., visibility of internal architectural state and control over the operation of the complex device being simulated.

A primary reason why a digital logic simulation is used by a digital design engineer is the accessibility and control over the design under scrutiny. Widdoes' VLSI hardware model fails to provide any clear visibility and control of the architecturally visible internal status and registers of the VLSI model. This is especially desired when software instructions need to be executed on simulated design. This capability is available only within software models for a VLSI device (or for a system) today. These software models can provide an in-circuit emulator (ICE) like environment for debugging the design.

As software models for complex VLSI devices are time consuming to develop and need a large engineering resource, they have only been successfully developed by large companies, such as International Business Machines (IBM) and Digital Equipment Corp. (DEC) for their flagship microprocessors, such as the IBM Power PC microprocessor and the DEC Alpha microprocessor. These software models provide complete visibility and control over simulation of the design while executing instructions. Hardware models cannot provide any debugging benefit as is available with these software models.

While the performance of a hardware model will be comparable to that of a software model for a single instance of the device, it is generally agreed that for multiple users or when multiple instances of a device are used within a simulation session, software models outperform hardware models. And overall both types of simulation models are still significantly too slow for a full-blown large system simulation using multiprocessing and parallel processing architectures as are designed today. But at present, while simulating with many of the commercial complex VLSI device models, the designer has to either forego extensive design analysis or make do with the limitation of the hardware models. Finally, only a large design team can justify the large capital investment for the hardware modeler.

For most of the other complex VLSI devices in the marketplace, the current simulation alternative is to use a software model (only available for some limited complex devices) or to use a hardware model. As both options are not only very expensive, but are also only partial solutions to a complete digital design and debug of complex systems, the design teams end up building a prototype of a partially simulated design. The prototypes are taken to an engineering lab and the final stage of design verification is completed using an ICE such as those sold by Intel Corp., Santa Clara, Calif. along with logic analysis tools such as those sold by Hewlett Packard Corp., Palo Alto, Calif. This method of design verification linearizes the design analysis phase followed by design verification phase, thus lengthening product introduction cycles and ultimately the product cost. Also the selection of complex VLSI devices gets frozen very early in the design analysis phase, thereby limiting the provision of an optimum set of design alternatives.

Most common types of microprocessors have ICE support from multiple vendors, but for complex Application Specific Standard Products (ASSP) and fabricated Application Specific Integrated Circuits (ASIC) there are very few ICE products to support development. U.S. Pat. No. 4,633,417 to Wilburn et al., Dec. 30, 1986, outlines an "Emulator for Non-fixed Instruction Set VLSI Devices". Also U.S. Pat. No. 4,782,461 to Mick et al., Nov. 1, 1988, shows an apparatus which improves upon Wilburn's emulator to allow emulation of multiple VLSI devices with breakpoint facilities. Like other ICE products, these systems address the debug accessibility of VLSI devices within digital systems once these have been designed and fabricated. Thus for early analysis using simulation tools, the apparatus proposed by these patents cannot benefit design teams.

U.S. Pat. No. 4,644,487 to Edward Smith, Feb. 17, 1987, outlines a "Method and Apparatus for Verifying the Design of Digital Electronic Components". This apparatus builds upon the same theme as Widdoes and lacks the visibility and controllability of simulated devices. Also the apparatus intends to work with a real target system, as opposed to a simulated system and the means described to complete the operation is very time consuming. The problem that the Smith patent proposes to resolve is quite successfully tackled by other technical means, i.e., by a few commercial products in the marketplace today, e.g., as made by Quickturn Design Systems, Mountain View, Calif. These commercial products take a designer's representation of the VLSI device in a netlist form (representation of the design consisting of interconnected basic logic elements) and utilize special software algorithms to program FPGAs (Field Programmable Gate Arrays) to emulate a real-time system with a reconfigurable netlist. These products provide higher performance in design simulation only when a design analysis is complete. Also they also lack the observability and controllability and to some extent, the interactions, provided by logic simulation tools. Finally, the Smith apparatus is useful only after the design analysis is thoroughly completed on logic simulators.

U.S. Pat. No. 4,901,259 to Watkins, Feb. 13, 1990, outlines an "ASIC Emulator" to emulate a custom VLSI device netlist a in real-time system setup using software to emulate the logic functions of the VLSI device. The drawback of this apparatus is that, unlike what the inventor states, the software model running under a software simulator will not have sufficient execution speed to emulate a VLSI device in a real system. With the pace of advancement of semiconductor technology, this has proven to be technically difficult to achieve. Real hardware systems today typically work at clock speeds of 50 Mhz and up. An ASIC that will be emulated on the hardware shown by Watkins needs to get back response from the software simulator at the 50 MHz rate. However, the software models on today's fastest commercial simulators working on a 50 Mhz workstations, provide only a few hundred simulated clock cycles per second at best. So the ASIC Emulator described by Watkins will not be able to synchronize generic hardware ASIC in the real world.

A typical example would be to consider emulation of a Dynamic Memory Refresh Controller Device using the method outlined. When the target system consists of a bank of Dynamic Random Access Memories (DRAM), the internal state of the DRAMs would be lost using this ASIC Emulator as the Dynamic Memory Refresh Controller would not be capable of running sufficiently fast to refresh the real target system. And as outlined above, there are commercial products (Quickturn Design Systems, Mountain View, Calif.) already in the market which have a better solutions for the problems outlined and proposed by Watkins. Finally, these ASIC emulation apparatus may be useful only after a design prototype system using the ASIC is produced and available in engineering lab. Thus, the tool proposed by Watkins may be useful only after the design analysis is thoroughly completed on logic simulators.

OBJECTS AND ADVANTAGES

Accordingly, several objects and advantages of the present invention referred to as (Emulation Modeling Apparatus) are:

- to provide an improved way to model a complex VLSI device;
- to provide an improved way to model an off-the-shelf component, or an ASIC under development, where the internal operation (architecturally visible status) are accessible to the simulation user for observability and control during design verification on a logic simulator;
- to provide special design methods which effectively mix two prior device control methodologies, namely hardware modeling and in-circuit emulation;
- to provide an apparatus to a designer which provides the ability to observe and to control commercial microprocessors and other VLSI devices used in a design while simulating these complex devices and the design on a logic simulator, thereby providing an efficient if-then-else scenario studies during the design analysis and verification cycles heretofore not available;
- to provide a tremendous savings in debugging effort and design analysis time to a design team, resulting in a broader and more complex design analysis;
- to provide cost savings in product development by reducing the design verification and system integration time due to the controllability and observability of VLSI devices being modeled;
- to provide an efficient and uniform response to accesses in simulating real VLSI devices under varying load conditions such as several users accessing a simulation device, or multiple representations of devices being used within a simulation session, or very long simulation sessions;
- to provide model information access means which avoids upper limits to simulation duration;
- to provide a simpler method of developing a complex VLSI model as opposed to a full function complex software model by working with information that is readily available in published data books by the manufacturer of the complex VLSI devices and by utilizing the actual functional accuracy of the model through special control of the VLSI device itself;

to provide a way to integrate system software very early in a design verification cycle while using logic (digital/ analog mixed mode) simulators on system designs that use microprocessor, such that the designer can set breakpoints on the internal operations of the microprocessor;

to provide a new way to integrate the use of emulation systems (as sold by Quickturn Design Systems, Mountain View, Calif.) into logic simulation and analysis, such that a design team can take a netlist for a VLSI device, load it onto an emulation systems and use the proposed emulation modeling apparatus to provide visibility and control within the ASIC being designed.

Further objects and advantages of my emulation modeling apparatus will become apparent from a consideration of the drawings and ensuing description.

BRIEF DESCRIPTION OF DRAWINGS

FIG. 3 shows a preferred embodiment of a model debug and user interface control for a designer's workstation which shows the control details of the graphical user interfaces, such as those shown in FIGS. 2A and 2B.

List of Reference Numerals

Figure 1:
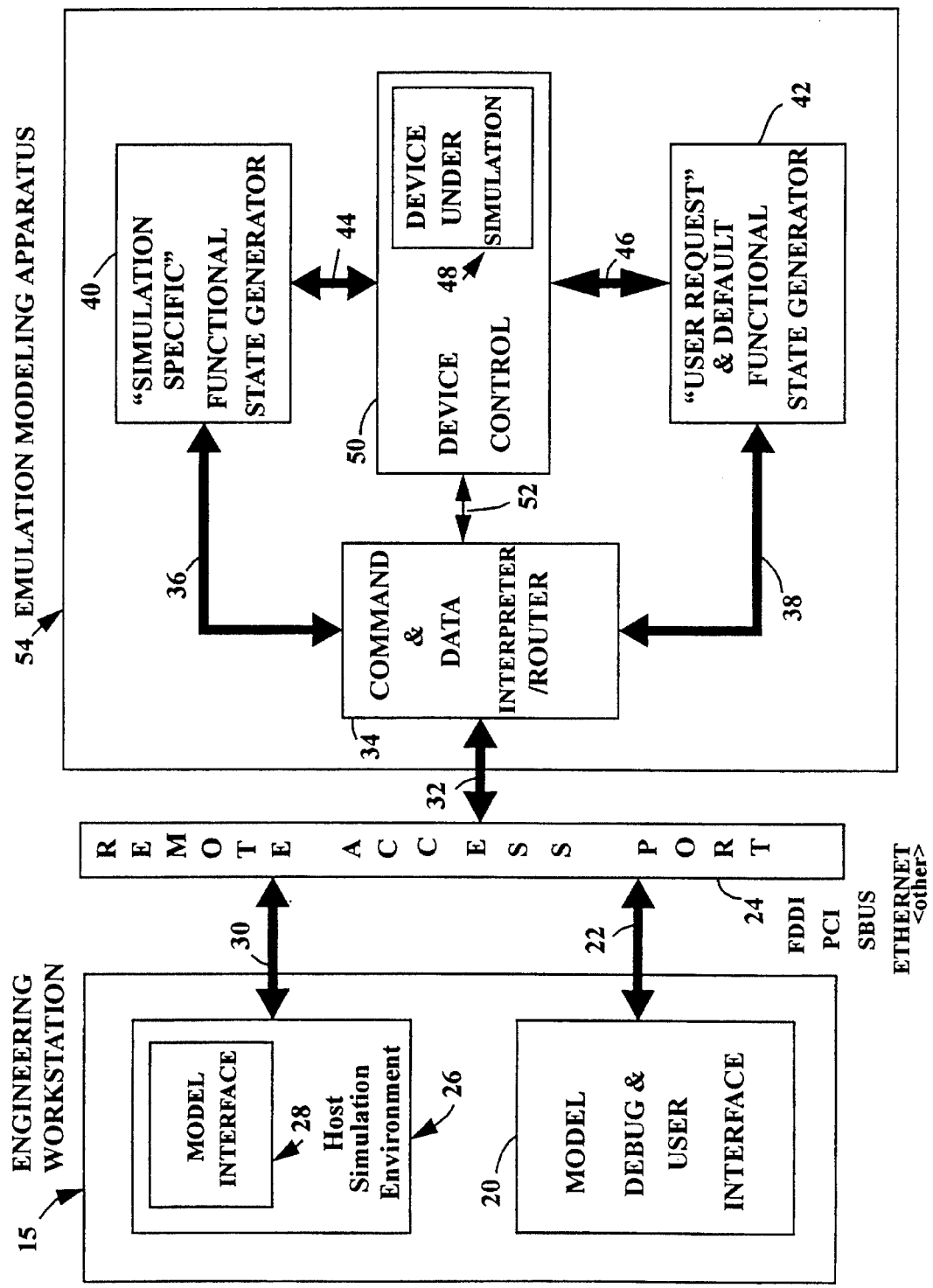
FIG. 1 is a block diagram of a simulation system with the emulation modeling apparatus in accordance with the invention.
Figure 4:
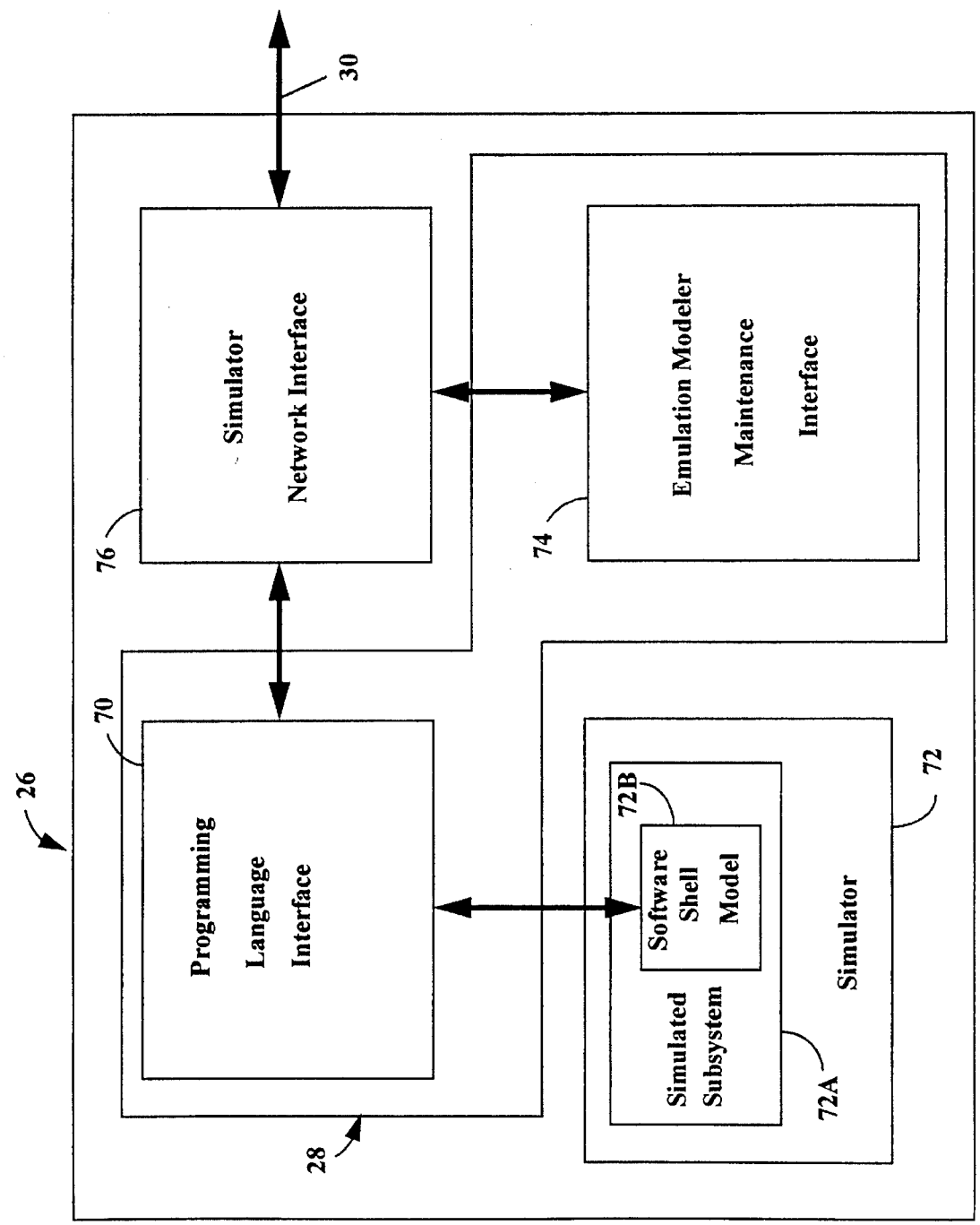
FIG. 4 shows a preferred embodiment of a simulation host workstation resident interface that allows the interfacing of a commercial logic simulator on the market with the emulation modeling apparatus.
Figure 5:
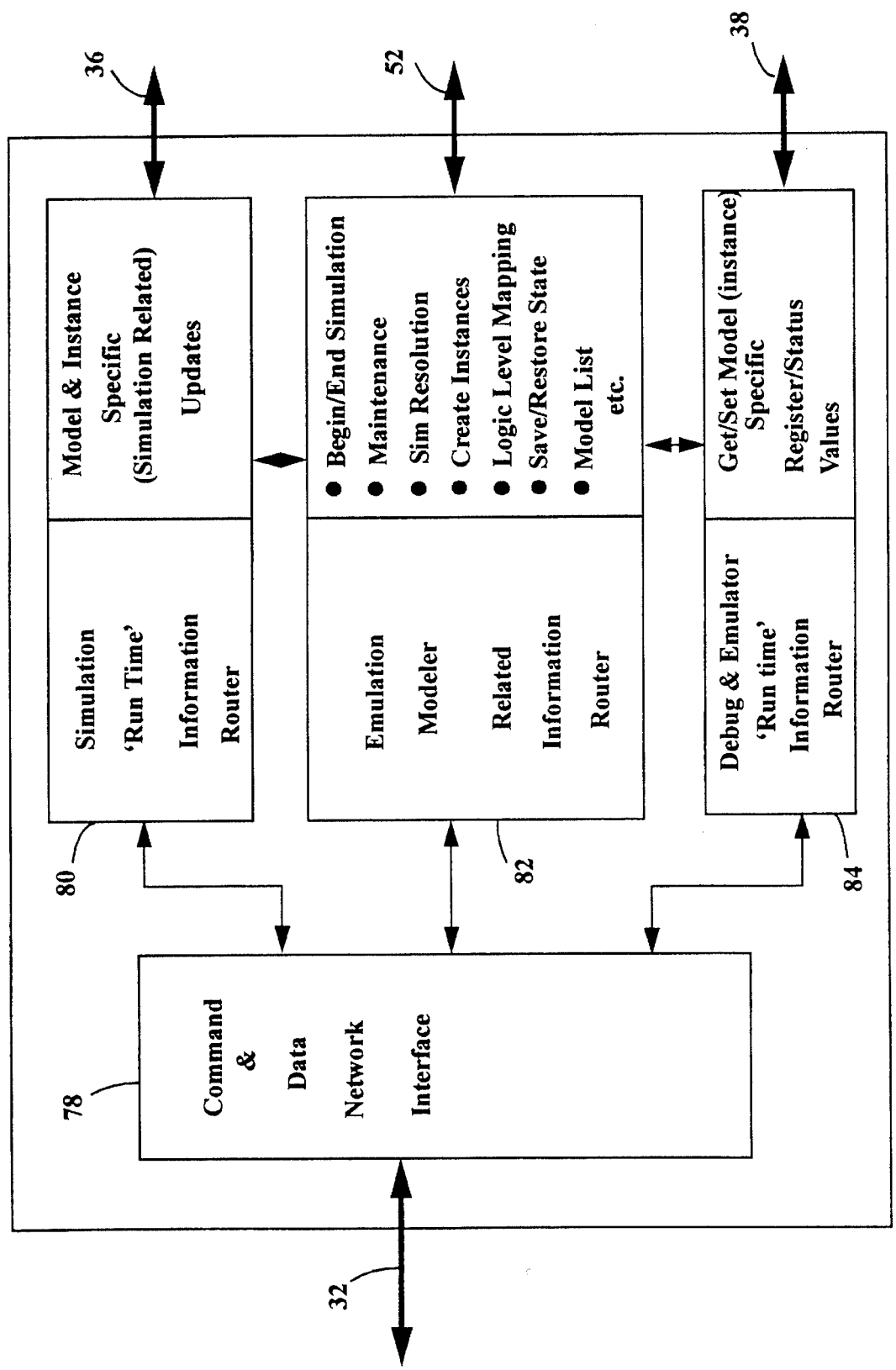
FIG. 5 shows a preferred embodiment of a command and data interpreter and router which allows the interfacing of the emulation modeling apparatus with the logic simulator as shown FIG. 4, and the graphical model debug and user interface as shown in FIG. 3.

FIG. 1
15—engineering workstation
20—model's debug and user interface
22—GUI communication channel
24—remote access port
26—host simulation environment
28—model interface
30—simulation communication channel
32—command and data channel
34—command and data interpreter and router
36—simulation command and data channel
38—emulation command and data channel
40—simulation specific functional state generator
42—user request and default functional state generator
44—simulation state machine channel
46—emulation and default state machine channel
48—device under simulation (DUS)
50—device control
52—maintenance command and data channel
54—emulation modeling apparatus FIG. 3
56—model type A control (Instance 1)
58—model type A control (Instance 2)
60—model type A control (Instance n)
62—model type N control (several instances)
64—model type A interface
66—model type N interface
68—emulation GUI network interface FIG. 4
70—programming language interface
72—simulator
72A—simulated subsystem
72B—software shell model
74—emulation modeler maintenance interface
76—simulator network interface FIG. 5
78—data and command network interface
80—simulation run-time information router (simulation related updates)
82—emulation modeler related information router (maintenance and setup updates)
84—debug & emulation run-time information router (emulation related updates)

Figure 6:
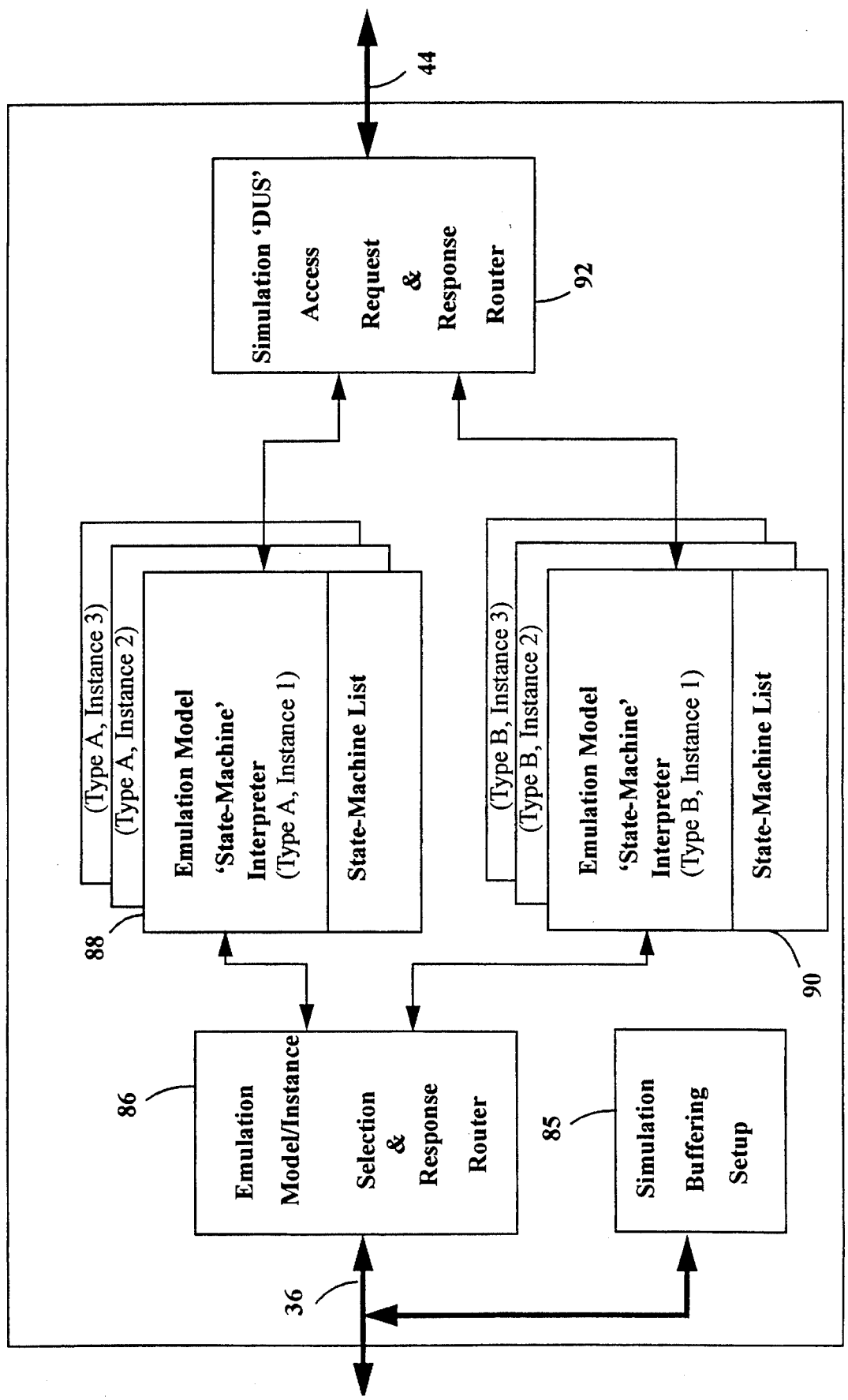
FIG. 6 shows a preferred embodiment of a simulation specific functional state generator for use with the command and data interpreter and router of FIG. 5.
Figure 7:
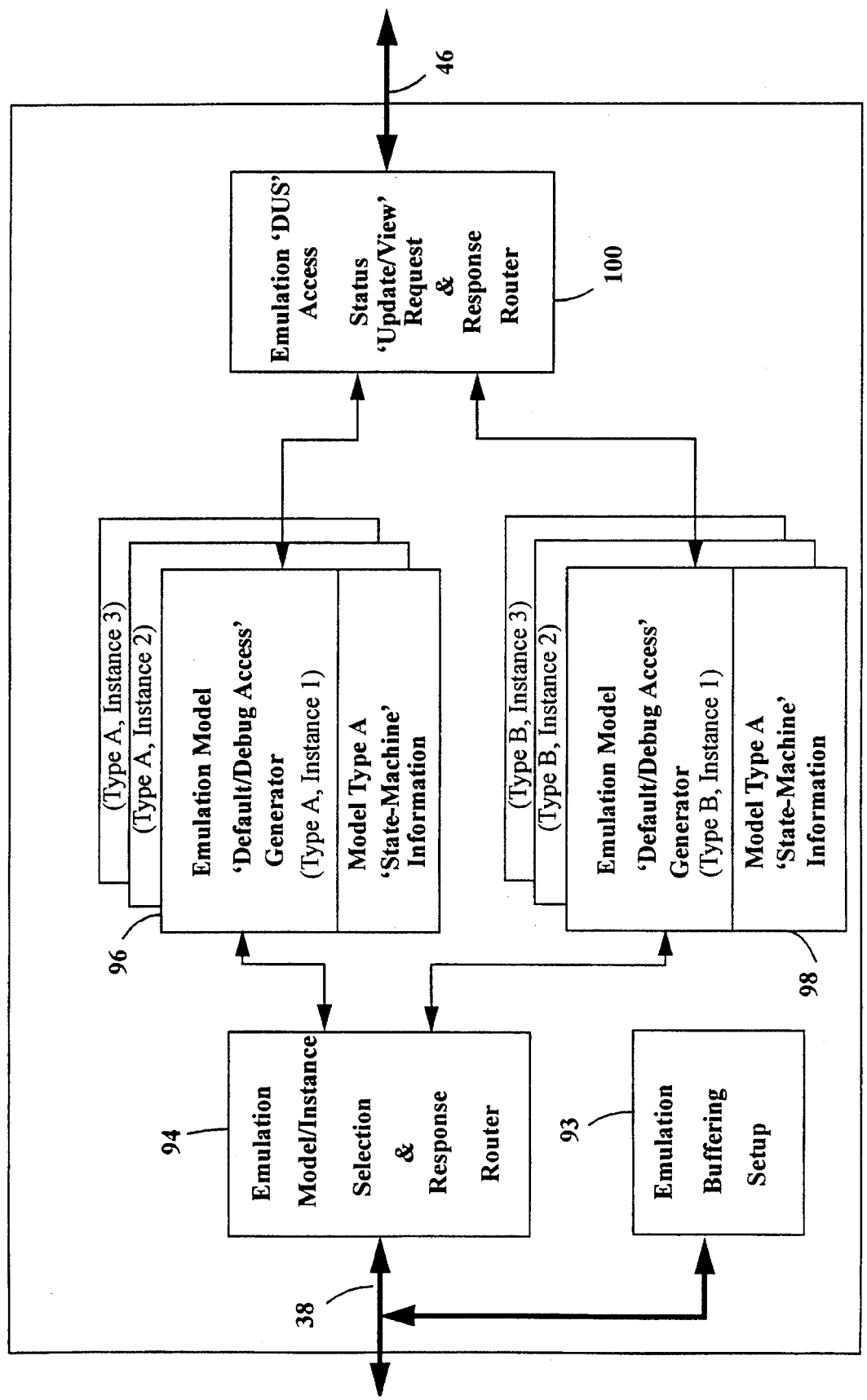
FIG. 7 shows a preferred embodiment of a user request and default functional state generator for use with the command and data interpreter and router of FIG. 5.
Figure 8:
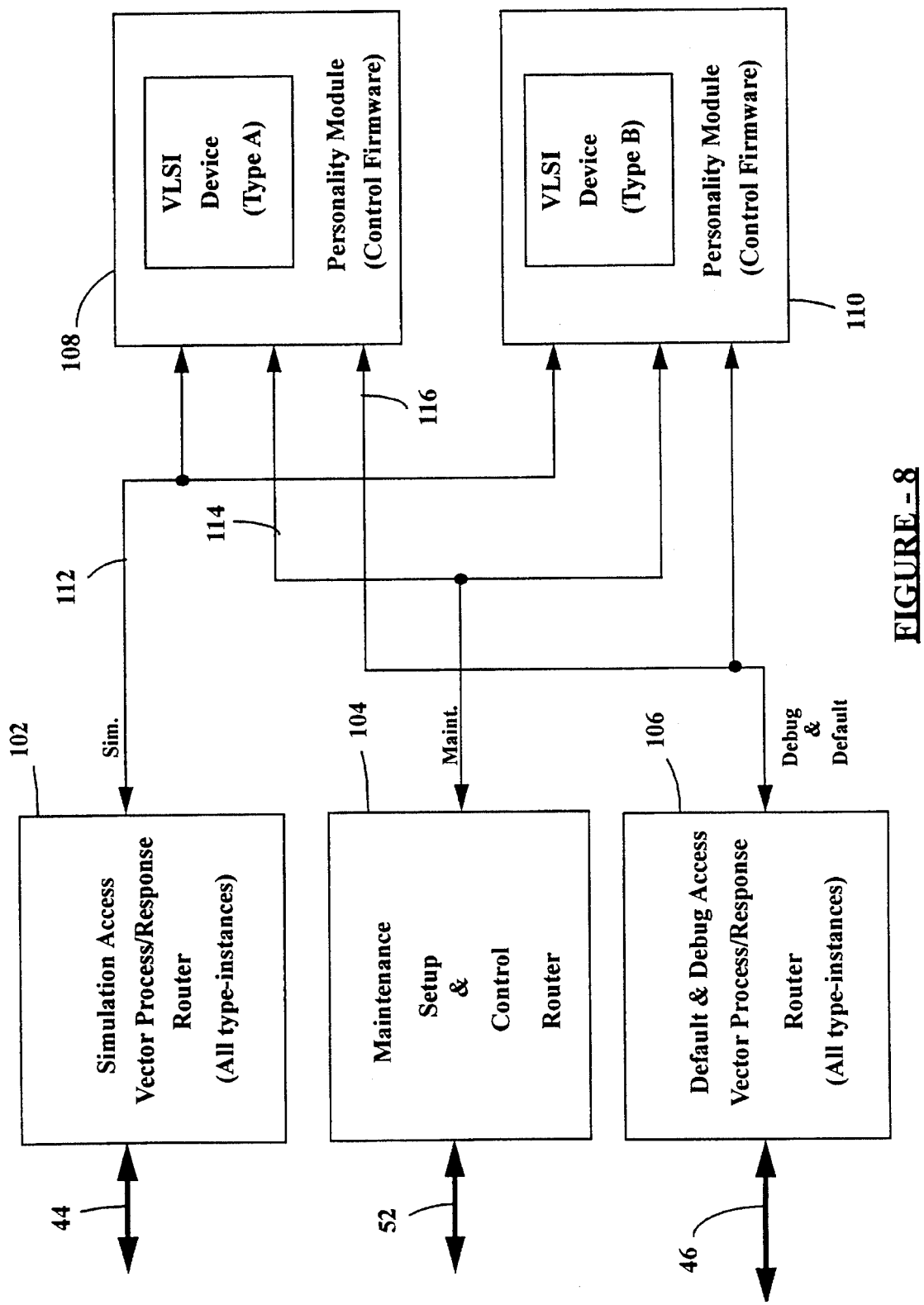
FIG. 8 shows a preferred embodiment of a device control for controlling a real VLSI device.
Figure 9A:
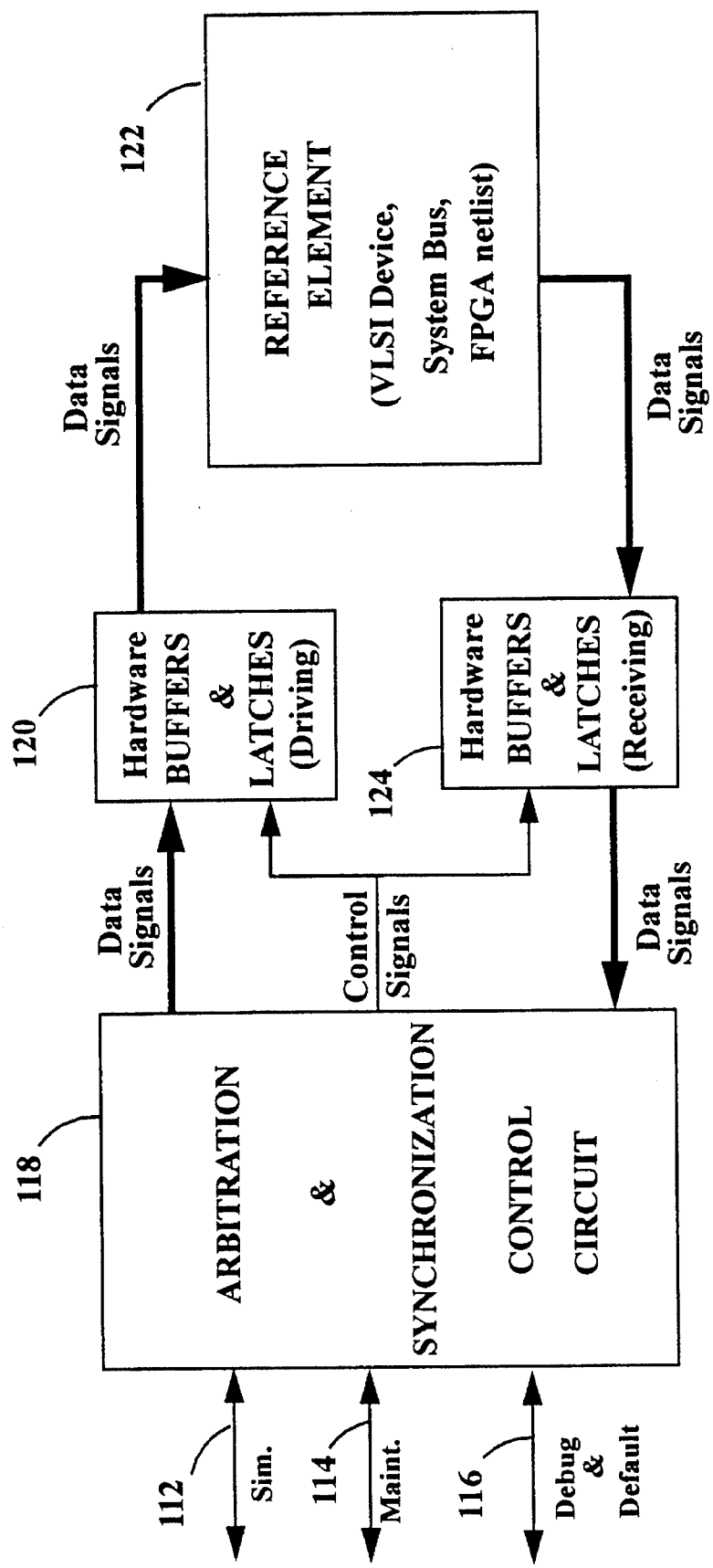
FIG. 9A shows a preferred embodiment of an emulation model personality module for use with device control of FIG. 8.
Figure 9B:
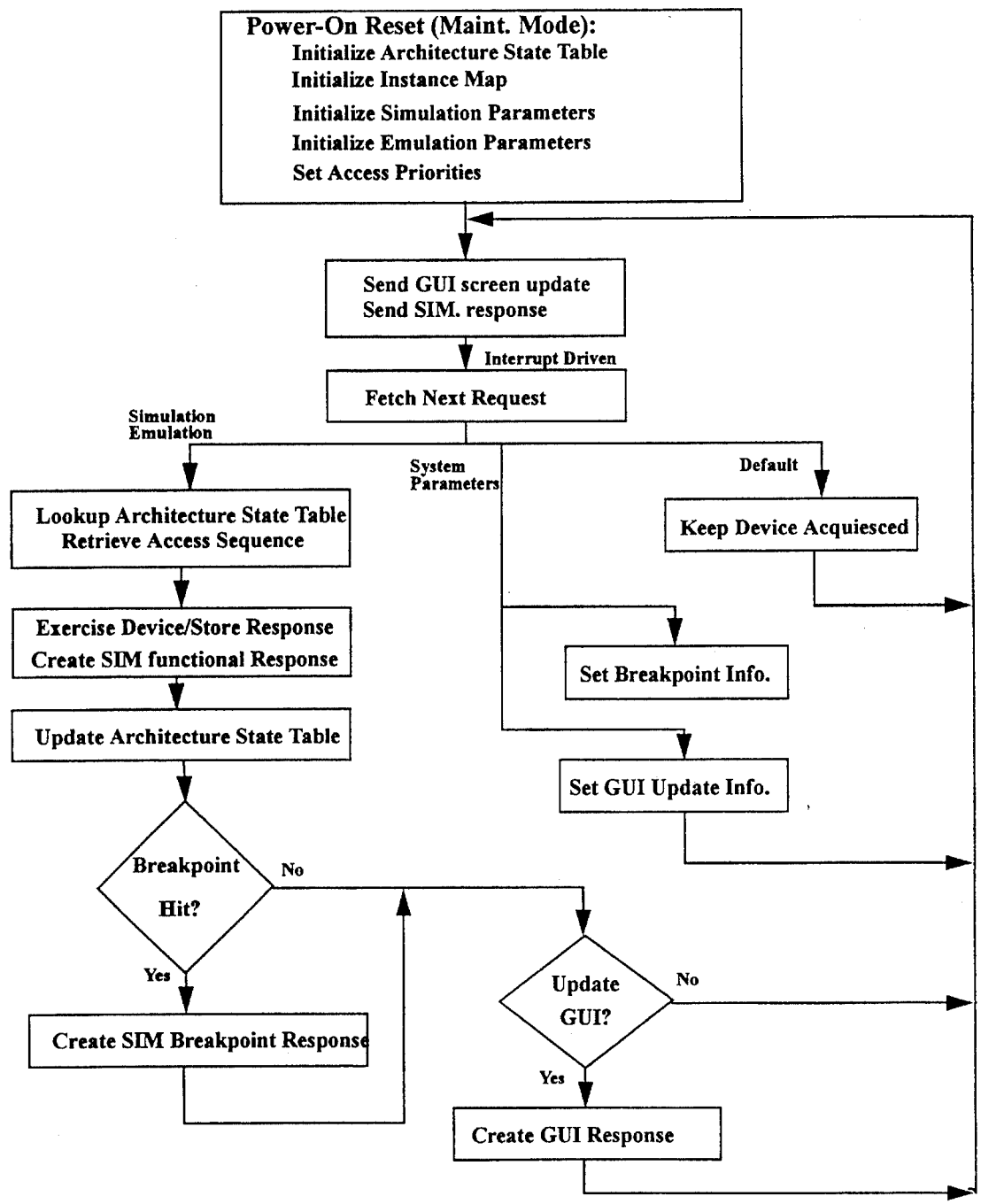
FIG. 9B shows a preferred embodiment of a flowchart for software which controls the emulation model personality module of FIG. 9A and device control of FIG. 8.

FIG. 6
85—simulation buffering setup
86—emulation model/instance selection and response router
88—emulation model state-machine interpreter (type A, instance 1 to n)
90—emulation model state-machine interpreter (type B, instance 1 to n)
92—simulation DUS access request and response router FIG. 7
93—emulation buffering setup
94—emulation model/instance selection and response router
96—emulation model default/debug access generator' (type A, instance 1 to n)
98—emulation model default/debug access generator' (type B, instance 1 to n)
100—emulation DUS access, status update/view request and response router FIG. 8
102—simulation access for vector processing/response (all types, instances)
104—maintenance, setup and control
106—default and debug access for vector processing/response (all types, instances)
108—personality module—VLSI device (type A)
110—personality module—VLSI device (type B)
112—simulation access request channel
114—emulation modeler system request channel
116—emulation debug and default access channel FIG. 9A
118—arbitration and synchronization control circuit
120—hardware buffers and latches (driving)
122—reference element (VLSI device, system bus, FPGA netlist etc.)
124—hardware buffers & latches (receiving)
FIG. 9B
Flowchart for the software which controls the emulation model personality module.
List of Acronyms
ASIC—Application Specific Integrated Circuit
ASSP—Application Specific Standard Product
DEC—Digital Equipment Corporation
DRAM—Dynamic Random Access Memory
DSP—Digital Signal Processing
DUS—Device Under Simulation
FDDI—Fiber Distributed Data Interface
FIFO—First In First Out
FPGA—Field Programmable Gate Arrays
GUI—Graphical User Interface
HDL—Hardware Description Language
IBM—International Business Machines
ICE—In-Circuit Emulation
LSI—Large Scale Integration
VLSI—Very Large Scale Integration
Summary This invention provides an emulation model for a VLSI device or a system, with the ability to observe and modify internal registers and status of a VLSI circuit, while being used in a simulated design. This emulation model combines in-circuit emulation techniques along with hardware modeling techniques to provide a simulation model capable of providing controllability and observability within the VLSI device or circuit being emulated within a simulated system. Normal device operations are continually submitted to the device in order to keep it in an acquiesced state such that the internal state of the device is kept operational and architecturally unmodified. A simulated functional access is gathered from the simulator and submitted to the device to change the internal state of the device to reflect the simulated access. Independently, any user request to view or alter the device's status is submitted to the device to reflect the user request. Any breakpoint operation requested by the user is monitored whenever a simulated functional access is submitted to the device. Breakpoint conditions then are reported back to the user and to the simulator to allow the user to effectively debug the simulated design.

Description—FIG. 1 Simulation System With Emulation Modeling Apparatus

FIG. 1 shows a block diagram of a simulation system with an emulation modeling apparatus in accordance with the invention. An engineering workstation 15 executes a host simulation environment 26. Environment 26 provides logic simulation, employing an emulation modeling apparatus 54 (also referred to as emulation modeler), to functionally emulate a device under simulation 48 (also referred to as a "DUS"). The internal operations of DUS 48 are made visible and allowed to be controlled via a model debug and user interface 20, which is also executed on workstation 15. Examples of devices or systems which are candidates for emulation models are microprocessors, complex peripheral controllers such as hard disk controllers, graphics accelerators, FDDI controllers, DSP devices etc., as well as systems consisting of a combination of these devices.

Environment 26 represents any commercial logic simulator environment (e.g., sold by Cadence Design Systems Inc. of San Jose, Calif.) which runs on commercial workstation 15 and provides a means to interface user-defined models into a simulated design. A model interface 28 (FIG. 4) is created for a device and its instances to be emulated within simulator 26. For each instance of the emulated device, there is a corresponding model debug and user interface 20. Interface 20 displays all relevant debug information to the user, and also accepts any request from the user to change or to set internal operational variables of the emulated device. Interface 20 is a graphical user interface (GUI) which works alongside simulator 26 on workstation 15.

All simulator specific information is passed to and from simulator 26 and emulation modeler 54 via a remote access port 24 with the use of a simulation communication channel 30, and a command and data channel 32. Likewise all emulation specific debug information is passed to and from interface 20 and emulation modeler 54 via remote access port 24 with the use of a GUI communication channel 22, and a command and data channel 32.

Emulation modeler 54 takes any information coming over channel 32 and parses the requests within a command and data interpreter and router 34. All simulation specific data is passed to a simulation specific functional state generator 40 via a simulation command and data channel 36, while all emulation specific requests and data are passed to a user request and default functional state generator 42 via an emulation command and data channel 38. Finally, all maintenance and system related requests are passed to a device control 50 via a maintenance command and data channel 52. Control 50 prepares DUS 48 upon power-on reset to remain in an acquiesced state. All emulation specific information and default state information for the device is passed to control 50 from state generator 42 via an emulation and default state machine channel 46. All simulation specific information is passed to control 50 from state generator 40 via a simulation state machine channel 44. Based upon the response from DUS 48, control 50 routes back the data to generators 40, 42, and router 34 via respective communication channels 44, 46, and 52. These responses are further funneled into interface 34 via channels 36, 38. Finally, emulation modeler 54 responds back to simulator 26 and interface 20 via channel 32, remote access port 24, and through communication channels 30 and 22, respectively.

Figure 2A:
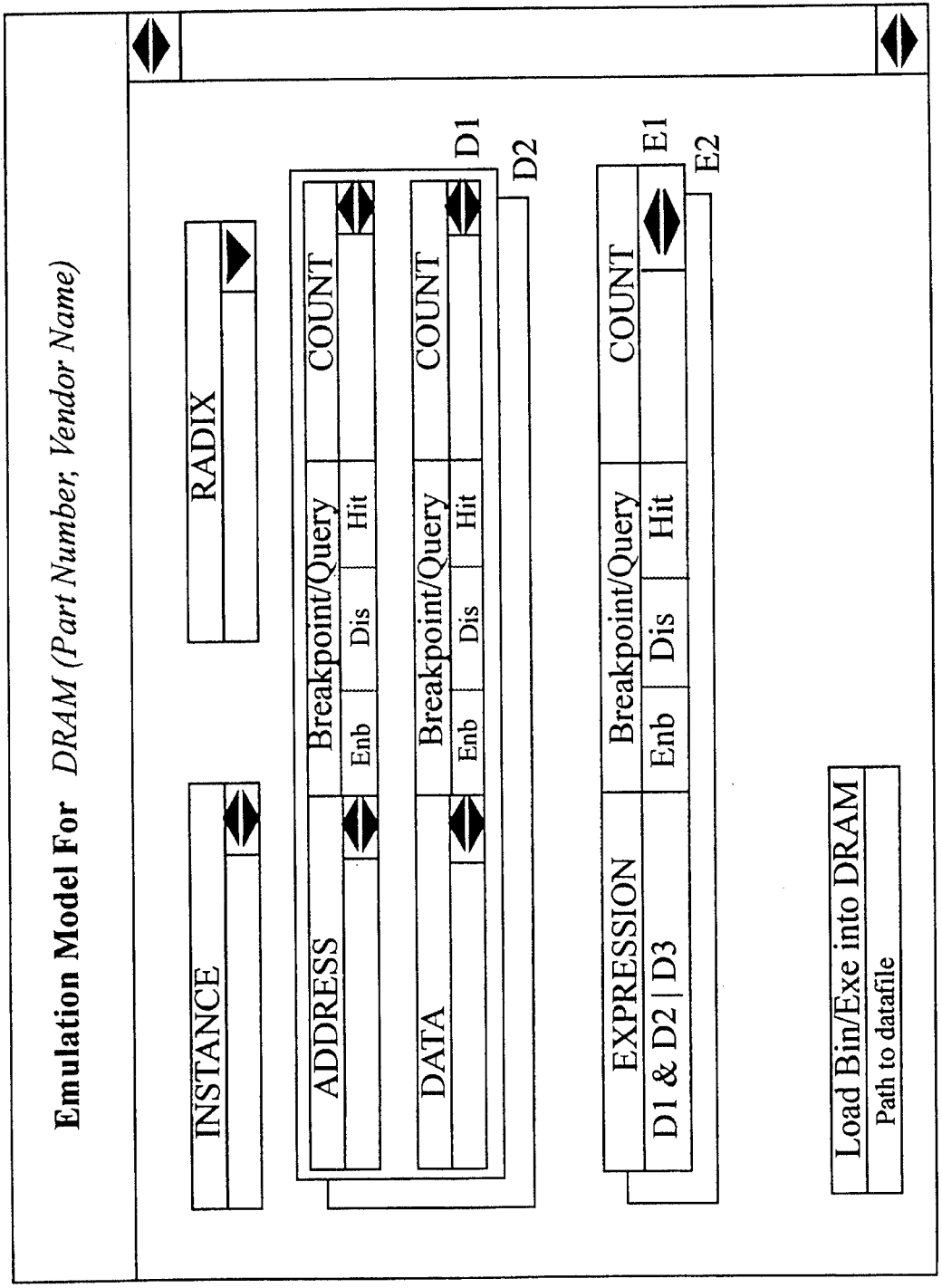
FIG. 2A is an example of graphical model debug and user interface that would be provided for modeling a dynamic random access memory device which would be supported by the emulation modeling apparatus of FIG. 1.
Figure 2B:
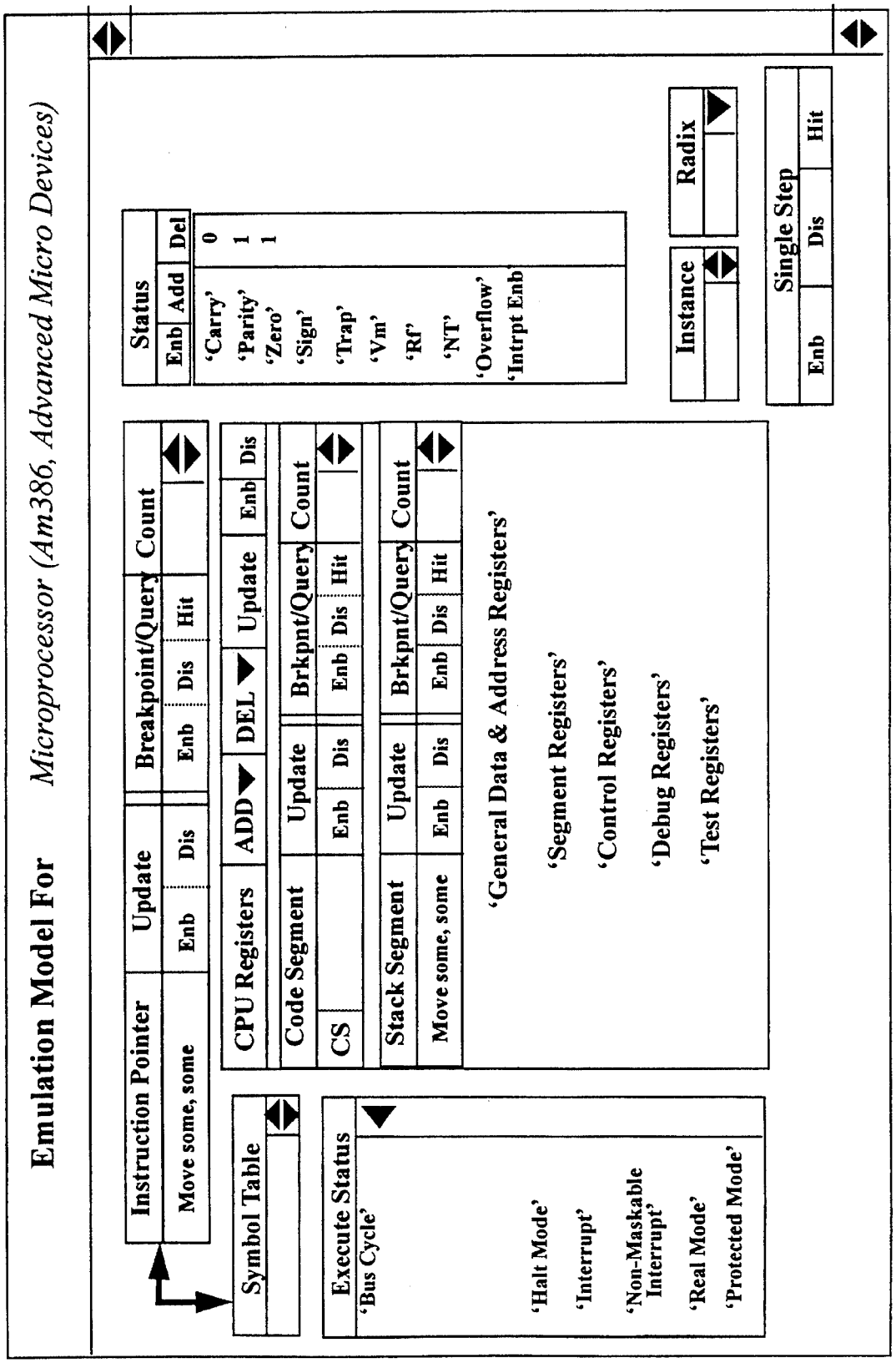
FIG. 2B is an example of graphical model debug and user interface that would be provided for modeling a microprocessor which would be supported by the emulation modeling apparatus of FIG. 1.

FIGS. 2A and 2B—Graphical User Interface Typical To A Simulation Model

FIGS. 2A and 2B show two representative graphical user interfaces (GUI) that are available to the user for emulation models for a memory device (DRAM) and a microprocessor. Similar interfaces are typically available for software simulation models or in-circuit emulators but are not available on hardware models.

FIG. 3—Model Debug and User Interface Control

FIG. 3 shows the details of interface 20. A model Type A control 56 (one representation of a GUI screen control) sets up and maintains control over a user interface similar to those shown in FIGS. 2A or 2B to control an emulation model Type A, instance 1. Similarly, control 58 and control 60 represent the control to manipulate the user interfaces for other instances of emulation model Type A. All related instances of model Type A pass their queries to and receive field updates from a model Type A interface 64. Interface 64 acts as a software buffer to communicate with emulation modeler 54 via an emulation GUI network interface 68 using a GUI communication channel 22. Other model types are supported similar to that described for Type A. Blocks 62, 66 and 68 represent the user interface support for model Type N instances.

FIG. 4—Simulation Host Workstation Resident Interface

FIG. 4 shows the details of simulation host workstation resident interface 26 (FIG. 1). A commercial simulator 72 (e.g. sold by Cadence Design Systems, San Jose, Calif.O is used to exercise a simulated subsystem 72A. Within subsystem 72A, a software shell model 72B is created to interface the simulator with the emulation modeler. (The method to invoke user defined models within a simulator is well within the skill of any designer knowledgable with the use of digital simulators and the programming language interface provided on most commercial simulators.) Software shell model 72B calls a programming language interface 70 to transfer data relevant for emulation modeler 54. An emulation modeler maintenance interface 74 provides the user interface to carry out routine maintenance tasks for setting up and providing normal emulation operation and routine diagnostics for emulation modeler 54. Blocks 70, 74, and 72B together represent model interface 28 of FIG. 1. The simulation accesses and command requests to modeler 54 from interface 70 and interface 74 are buffered by a simulator network interface 76. Interface 76 uses a simulation communication channel 30 to pass the simulation information and commands to modeler 54 and in return receives the simulation data and the response to commands which it passes back to blocks 70 and 74. Block 70 communicates with shell model 72B to allow simulator 72 to further advance the simulation on simulated subsystem 72A.

FIG. 5—Command and Data Interpreter and Router

FIG. 5 shows the details of a command and data interpreter and router 34 (FIG. 1). All the requests to and from emulation modeler 54 are routed through a command and data channel 32. A command and data network interface 78 interprets the command and the data packets and farms out relevant packets to a simulation 'run-time' information router 80, an emulation modeler related information router 82, and a debug and emulation 'run-time' information router 84. Routers 80, 82 and 84 act as bidirectional software buffers. Router 80 provides the buffering for simulation related information and communicates with a simulation specific functional state generator 40 (FIG. 1) via a simulation command and data channel 36. Router 82 provides the buffering for maintenance related information and communicates with device control 50 (FIG. 1) via a maintenance command and data channel 52. Router 84 provides the buffering for debug run-time information and communicates with state generator 42 (FIG. 1) via an emulation command and data channel 38. All the responses received by channels 36, 52, and 38 are passed to routers 80, 82, and 84 which then transfer them to block 78, which in turn passes all responses to channel 32.

FIG. 6—Simulation Specific Functional State Generator

FIG. 6 shows the details of a simulation specific functional state generator 40 (FIG. 1). A simulation buffering setup 85 sets up all required software queues to buffers simulation specific data and command coming over from simulation environment 26. All simulation specific run-time information is received via channel 36 by an emulation model (instance) selection and response router 86. Router 86 determines which specific type and instance of emulation model the 'simulation request and response' is for. Accordingly, the information is passed to one of several possible emulation state-machine interpreter 88, 90, etc. Interpreter 88 identifies what functional state change access was requested and accordingly pulls up a list of access patterns to be applied to DUS 48. This access list is passed on to a simulation 'DUS' access request and response router 92. A similar function to that performed in interpreter 88 is performed by other emulation model state-machine interpreter 90, etc. representing other emulation model types and instances. Router 92 passes the access lists received from the various interpreter blocks to the device control 50 (FIG. 1) via a simulation state-machine channel 44. The state change update from device control 50 is received back by router 92 which passes the related functional state change to one of interpreters 88, 90, etc. This response is further passed back to router 86, which in turn passes all responses to channel 36.

FIG. 7—User Request and Default Functional State Generator

FIG. 7 shows the details of an emulation specific and default functional state generator 42 (FIG. 1). A emulation buffering setup 93 sets up all required software queues to buffers emulation specific data and command coming over from user interface 20. All emulation specific information is received via channel 38 by an emulation model (instance) selection and response router 94. Router 94 determines which specific type and instance of emulation model the 'user and debug request' is for. Accordingly, the information is passed to one of several possible emulation model default/debug access generators 96, 98, etc. Generator 96 identifies what debug or functional state change access was requested and accordingly either prepares an emulation command or pulls up a list of access patterns to be applied to the device under simulation. This access list or command is passed on to a status 'update/view' request and response router 100. A similar function to that performed in generator 96 is performed by other generator 98, etc. for other emulation model types and instances. Router 100 passes the debug command or access list to device control 50 (FIG. 1) via an emulation and default state machine channel 46. The state change update from control 50 is received back by router 100 which passes the related functional state change to one of generators 96, 98, etc. This response is further passed back to router 94 which in turn passes it on to channel 38.

FIG. 8—Device Control

FIG. 8 shows the details of device control 50 (FIG. 1). The three types of accesses to DUS 48 are received by three separate channels 44, 52, and 46. Simulation specific requests and responses are handled by a simulation access vector process and response router 102. Maintenance and diagnostic specific requests and responses are handled by a maintenance, setup, and control router 104. And emulation specific requests and responses are handled by a debug (default) access vector process and response router 106. Routers 102, 104, and 106 act as bidirectional software buffers for passing requests and responses for all VLSI devices models and related instances. DUS 48 (FIG. 1) is represented in FIG. 8 as several personality modules 108, 110, etc. An emulation model needs to utilize information specific to the device being simulated (from relevant data provided in the manufacture's data sheets) to control one VLSI device supported by the emulation modeling apparatus. The control method is common to all devices whereas the information governing the operational aspect is unique or personal to a device thus the module is referred to as the personality module. Individual VLSI device (type A, and related representations) are controlled by personality module 108. Similarly other VLSI devices are controlled by similar personality modules 110 etc. Simulation related access and response to and from router 102 to all VLSI devices are passed via a simulation access request channel 112. Emulation modeler system request and response to and from router 104 to all VLSI devices are passed via an emulation modeler system request channel 114. And finally user debug request and response to and from router 106 to all VLSI devices are passed via an emulation debug and default access channel 116. These same channels 112, 114, and 116 are used respectively to send back responses from the personality modules 108, 110, etc. to the routers 102, 104, and 106 which pass back the responses over the channels 44, 52, and 46.

FIGS. 9A and 9B—Emulation Model Personality Module with Flowchart

FIG. 9A shows the details of one of a typical device under simulation 48 (FIG. 1). The details of interface to this modules were described above as personality modules 108, 110, etc. (This is the only module which uses firmware. Any designer skilled in firmware development will be able to use the descriptions and the flowchart on FIG. 9B to build emulation model personality module 108, 110, etc. for a device under simulation.) This module interfaces with a reference element 122. This module is central in keeping reference element 122 in a known valid state for reference element 122 to function as a simulation model while independently allowing the user to view and change the internal registers of reference element 122. Three access type informations are received by an arbitration and synchronization control circuit 118 via three channels 112, 114, and 116 described above in connection with FIG. 8.

FIG. 9B is a flowchart detailing how this arbitration and synchronization is performed by circuit 118. Reference element 122 is controlled continually by circuit 118 via hardware buffers and latches 120 and 124. Upon power-on-reset and whenever there is no functional access, reference element 122 is kept in a quiescent state by applying a default set of stimuli to reference element 122. When a valid access is requested, reference element 122 is brought out from the quiescent state and new access applied, the response is monitored and then farmed back to one of appropriate channels 112, 114, or 116. Reference element 122 is again made to go back to quiescent state until later time when simulator 72 or the user interface 20 needs to access it.

Theory of Operation

In basic theory, a logic simulator exercises a simulation model with a new set of stimuli, representing the external hookup and effects within a simulated logic design. After receiving the response from the simulation model, the logic simulator queues the changes that this response will generate to other devices connected to this model within the simulated design. The scenario is repeated in an advancing simulation time frame on all such simulated models.

Upon receiving a new set of stimuli, a software model traverses an internal state machine representing the behavior of the simulated device, determines the new response to the rest of the design, and passes this information to the simulator. As all the tasks described above are executed in software, there is a very high degree of flexibility in the debug capabilities supported. Software models thus easily lend themselves to control and visibility of the internal registers and status of the device being represented in simulation.

In a hardware model, a software shell model is created to hold the place of hardware model in the simulated design. As the simulator exercises the shell model with simulated patterns, the shell model passes on these simulation patterns to the hardware modeler. The hardware model now exercises a real device under simulation by first resetting the device, and then replaying at full speed, the complete history of the stimulus patterns from simulation time zero and then applying the new simulation pattern. This makes the device behave in real time as a correctly functional device up to the point where new functional response is valid. The response from the device is captured and submitted back to the simulator to pass it on to the rest of the simulated design with the use of the shell model. Each incremental change in the simulation patterns causes the scenario described above to be replayed over and over again. As the history of the pattern grows with each change, the capacity of the hardware model to simulate further reduces. Also the performance starts to degrade as the depth of the pattern that need to be replayed increases dramatically. Finally, this approach inhibits any control and visibility within the device being simulated, although it does provide an avenue to accurately model the behavior of a complex off-the-shelf VLSI device even to the point of reflecting a design bug within the device being simulated.

On the In-Circuit Emulation (ICE) front, a VLSI device is controlled by an emulator to provide an alternate access to the target system (real board or system). Either the emulator provides the debug control over the VLSI device or the emulator allows the target system to continue with normal operation. The emulator has control over the VLSI device and provides the user with visibility and control over the VLSI device while it is being exercised in the real target machine.

Merging the concept of the three techniques described above, an emulation model operates as follows: The first task is to identify all the system (functional) accesses that this device will respond to in normal course of usage. Next a functional state machine is defined for each system (functional) access to the device. This provides a finite list of access stimuli sets. (This information is readily available in the manufacturer's data book for the device.) Having identified the valid functional accesses to the device, the physical VLSI device is controlled to respond to external accesses in two ways. One is from the simulator, where the simulated design stimulus will access the internal state of the device. (Using one of a predetermined sequence of simulation patterns which represent an architectural state change, called 'a functional access set'. The data for the access comes from the simulator.) The second access is from a Graphical User Interface (GUI), where access to internal Registers and Status is available for observing and changing. (The GUI access is also one of the earlier predetermined access pattern sequence, called 'an emulation access set', that is applied to the device to alter or to observe the architecturally visible state of the device.) Each access can be viewed as a pre-defined set of stimuli to which the device will respond. At a given time, one or the other access is allowed with the submittal of a sequential stimulus set. The main key feature that makes the emulation modeling possible is to identify one (or a representative few) 'emulation access sets' which keep the device in a 'quiescent state'. (No operational loss of internal data occurs while a device is kept in the quiescent state.) Once this 'quiescent access set' is identified, then the device is made to stay in a normal quiescent state in between any functional access, be it via the simulator or via the GUI. There is no need for resetting or replaying the history of simulation patterns as was needed in a 'hardware model'. This method to keep the device logically and functionally correct, by keeping it in a quiescent state, is totally different from the hardware modeler and it is this that allows the ICE like feature within a logic simulation.

First, a software shell model is created to represent the emulation model within the simulator (FIG. 4), just as in a hardware model. Additionally, this shell model is designed with the knowledge about the architecturally visible state transitions of the device being emulated just like it is done in an ICE. Unlike a full-blown software model, this shell model only works with external access of the device being modeled. Only when one complete architecturally functional state transition is detected by the shell model that the emulation modeler is requested to exercise the real VLSI device. In the meantime, the real VLSI device is kept in a quiescent state such that there is no loss of internal data to the device. Upon receiving the simulated functional access request, the emulation modeler brings the device out from the quiescent state and exercises the device with the simulated request. The response to the architectural functional access is captured and the device is put back into the quiescent state. The response is then farmed back to the software shell model to be submitted to the simulator.

Independently, a graphical user interface is provided as in an ICE (FIG. 1, 2A and 2B) to allow the user to view and change architecturally visible internal status and registers of the VLSI device being simulated. The user requests (in the form of emulation access sets) to effect state changes internal to the device are passed to the emulation modeler. The emulation modeler arbitrates the device access between the simulator and the user. The device is brought out from the quiescent state, the new user request is submitted, a response is registered, and the device set back into the quiescent state. The response is then passed back to the graphical user interface for updating the screen for the user.

As in an ICE, the user is allowed to set breakpoints on various conditions of the device's internal status being altered. The command to monitor the breakpoint is sent to the emulation modeler. While the emulation modeler is submitting a functional access to the VLSI device as requested from the simulated system, the breakpoint condition is monitored for being valid. If this is true, then along with providing the normal functional response to the simulator, the emulation modeler also tags the information showing breakpoint being asserted. The software shell model then submits a 'STOP' simulation command to the simulator which passes the simulation control to the user. Thus the user can then take any further debugging actions on the simulated design.

Assume that we need to model a Dynamic Random Access Memory (DRAM). First we will briefly describe how a 'hardware modeler' tackles this task and next we will provide the new method (similar to an ICE) to make it an emulation model. In order to keep the simulation results correct while simulating the DRAM, the 'hardware model' needs to submit each new vector only after it has submitted all the previous simulation vectors to the DRAM. At each new vector submission, the device is reset, then submitted with the complete history of the previous simulation followed by the last new vector. The depth of the history patterns increases over simulated time, and soon, the practical pattern storage limit is hit after which no further simulation can be carried out. Also no internal states of the DRAM model can be changed independent of the logic simulator via a graphical user interface.

Now in the case for an 'emulation model', the sequence of patterns to keep the device in a quiescent state is first identified while building the model. For a DRAM device, this happens to be a 'Refresh Cycle'. The DRAM device will constantly be kept in the quiescent state by applying 'Refresh Cycles' until such time that an access is required from the simulator or from the GUI. The simulator interface for this DRAM model is a software shell model which provides for the state change interpretation for the DRAM model. These are 'Read and Write Cycles', 'PAGE Mode Read and Write Cycles', 'Refresh Cycles' etc. On each new simulation access, this software shell model keeps the simulation current by responding locally.

Upon initialization, emulation modeler keeps the DRAM device in a quiescent state by applying regular 'Refresh Cycles'. This is the highest priority task for the emulation modeler. This way, the DRAM device will never loose any internal data. As soon as a valid functional access is buffered, e.g. a 'READ CYCLE', the software shell model submits a 'Read Cycle' request to the emulation modeler. The emulation modeler subsequently, in real time, brings the DRAM device out of quiescent state (stops the 'Refresh Cycle') and submits the new simulation functional access set (a 'Read Cycle'). After recording the DRAM device response, ('STORED DATA') the device is again put back into the quiescent state (continue with the 'Refresh Cycle'). This complete device access is carried out at manufacturer recommended real-time speed. The response from the device is then passed back to the software shell model which provides the data back to the simulator in simulated time. Independently, when the designer wants to query the DRAM device to read or to change any location within the DRAM from outside of the simulation, the designer submits this request to the emulation modeler GUI (FIG. 2A). The emulation modeler then forms the necessary emulation access set and submits it to the DRAM after bringing it out of the quiescent state. The emulation modeler then takes the response and passes it back to the GUI which updates the data on the debug screen. The next 'READ' access from the simulator to this location now brings updated data as set by the user interface. Thus both the simulator and the designer have concurrent yet independent access to the devices being emulated under simulation.

This feature of keeping a device in a quiescent state allows a new simulation functional access to proceed very rapidly. There is absolutely no need to repeat the complete history of the stimulus sets on each simulation pattern change. A complete functional access is interpreted at the simulator end and submitted as a complete state change request to the emulation model. This reduces the network traffic between the simulator and the emulation modeler significantly. Upon receiving the simulation access request, the emulation modeler interprets and submits a proper functional access set at near full speed to the device in between the quiescent accesses. At any given time, the 'emulation modeler' keeps track of only the architecturally visible state of the device as is published by the manufacturers' data sheets. This is a small finite set of registers and status values changes. When multiple instances of an emulation model are employed, or multiple users need to access the same emulation model, only a linear increase in overhead is envisaged. This is so because only a small queue (fixed length for any typical emulation model) of functional state change stimuli sets need to be submitted to the emulation model to make it architecturally compatible to the current state of an instance following which the new functional access set may be submitted. As the state change occurs in near full speed of the device, the overhead is very insignificant in comparison to an event scheduler of the host software simulator. The major bottleneck is the software simulator generating the new stream of vector set to complete the functional access. Most of the time, the emulation modeler is waiting for the software simulator.

A very useful feature that is made possible is that the current state of the VLSI device being emulated can be easily queried and saved, and later (next day) restored for ongoing design simulations and analysis. There is no upper limit on simulation duration with this method used in providing an emulation model.

Thus, the present emulation modeler works efficiently at the architectural level for simulating a real VLSI device without loss of accuracy, providing complete visibility and control over the operation of the VLSI device within a logic simulator. The modeling method outlined overcomes all the current limitations of various other methods of providing simulation models for large complex VLSI devices and systems.

Operation of Emulation Modeling Apparatus

Most of the blocks of the preferred embodiment described below are developed in software using methods and structures well known and documented in technical books and journals. Only the emulation model personality module (described on FIG. 9A) to control the device under simulation will be described as firmware. The detailed flowchart for the firmware is outlined in FIG. 9B. The emulation modeling apparatus can be readily developed as outlined by those with ordinary skills in the field of simulator tools design, along with the present descriptions.

Operation—FIGS. 1 and 4

Looking at FIG. 1, the operation of host simulation environment 26 is as follows. Environment 26 can be any commercial simulation environment (e.g., as supplied by Cadence Design Systems, San Jose, Calif.) which runs on an engineering workstation 15 (e.g., as supplied by SUN Microsystems, Mountain View, Calif.).

When the user starts a new simulation session, model interface 28 is invoked. Interface 28 is the first item that starts the operation of emulation modeler 54 within environment 26. Details of environment 26 and interface 28 are shown in FIG. 4.

First, simulator 72 is started on workstation 15, along with an emulation modeler maintenance interface 74. Maintenance interface 74 sends a command to emulation modeling apparatus 54 (also called emulation modeler) to initialize and prepare a new simulation session. The information contained in such a simulation session is: session identification number, simulator parameters, error handling information, logic level mappings, simulation resolution etc.

This command is sent to a simulator network interface 76 to be sent out to emulation modeler 54. Interface 76 makes use of simulation communication channel 30 (Remote Process Communication routines or RPC under UNIX) to communicate with emulation modeler 54 remotely over a remote access port 24 (a network such as ethernet). These 'Remote Process Communication Routines' are well documented and are available in the technical manuals and books in the bookstores.

When emulation modeler 54 prepares itself for a new simulation session, it sends a response back to maintenance interface 74.

Other commands that maintenance interface 74 will support are:

1. Beginning and ending of simulation session.
2. Handling of error and warning messages.
3. Setting up simulation time resolution and logic level mappings.
4. Creating device instances.
5. Mapping pins between model represented in simulator and emulation modeler.
6. Providing current simulation time information to the emulation modeler.
7. Exchanging model functional tuples between simulator and emulation modeler for various instances.

Interface 74 is also intended to enable the user to find current status of the emulation modeler. This is not functional information but more in the nature of maintenance access port. The tasks supported can include such items as power up/down the modeler, provide a list of available emulation model types, number of users on line, reboot modeler etc.

Operation—FIG. 1 and 4

Referring back to FIG. 4, preparing an emulation model for a device consists of creating a software shell model 72B written in a Hardware Description Language (HDL). This shell model 72B is set up to represent the emulation model within a simulated subsystem 72A, to be exercised within any commercial simulator 72. Shell model 72B is a common model code written to send simulation data and commands to the emulation model to and from simulator 72 and a programming language interface 70 for the emulation model.

Upon first invocation, shell model 72B sends a command to interface 70 to start a new session. This command is sent over using Inter Process Communication routines, (IPC under UNIX, a well documented software communication routines) to maintenance interface 74 which in turn, sends a command to emulation modeler 54 to prepare device under simulation 48. Upon receiving a response from emulation modeler 54 when device under simulation 48 is ready, maintenance interface 74 spawns a new process called a model debug and user interface 20 on workstation 15.

When this setup is complete, interface 70 is allowed to continue with the beginning of a new simulation session on simulator 72. All the simulation events pertaining to software shell model 72B used in simulated subsystem 72A on simulator 72 are from here onward sent over to interface 70 where these pin changes are interpreted by an architectural state transition interpreter routines. As long as a valid functional state change is not achieved, interface 70, with the use of shell model 72B, keeps responding locally to simulator 72. A valid functional state change is represented by a sequence of predetermined stimulus sets along with simulation dependant data values which represent a complete architecturally visible state change within the simulated device. I will call this a "functional state tuple". In normal course of usage, a device will respond to a small finite set of such "functional state tuples" in any given operational mode. This information is readily available in manufacturer provided data book on the device.

When a complete and valid functional state change event is received (functional state tuple), a request packet is created by interface 70 representing a code for the functional state tuple and relevant simulation data. This request packet is passed over to simulator network interface 76 to be sent to emulation modeler 54 using simulation communication channel 30. Channel 30 consist of simple RPC routines to communicate between software tasks. Upon receiving the response sent over by emulation modeler 54 from DUS 48 for the current pending functional state tuple, interface 70 allows shell model 72B, with simulator 72, to advance simulated subsystem 72A.

The following is the basic scenario carried out after the user starts a new simulation session: all simulator updates are handled by shell model 72B, interfaces 70 and 76. All pin changes to emulation modeler 54 are directed by shell model 72B to interface 70. Interface 70 is a set of routines to decode architecturally visible accesses for the given DUS 48. Interface 70 locally responds back to shell model 72B until such simulation pin change sequence, when a complete architecturally visible state change is detected. At such time, interface 70 prepares a simulation functional tuple, to be sent out to emulation modeler 54 to exercise the real VLSI device using communication channels described above. Emulation modeler 54 submits the new simulation functional tuple on DUS 48, monitors the response, and returns the response to interface 70. Interface 70, completes the current simulation sequence representing one functional access. At each access to DUS 48, emulation modeler 54 monitors if user requested breakpoint is asserted due to the simulation update. If this is true, then breakpoint information is tagged along with the normal functional response. The breakpoint information then allows shell model 72B to stop the simulator 72 so that the user may observe the results on other affected areas of the design on simulated system 72A.

When the user wants to save the state of the simulation session or close the simulation session, the request is submitted to maintenance interface 74. A command packet to this effect is sent to emulation modeler 54. If the command is to save the state of a simulation session, emulation modeler 54 queries DUS 48 and retrieves the complete architectural state of the VLSI device under simulation and sends it to maintenance interface 74. And if the command is to close the simulation session, modeler 54 acknowledges the release of the emulation model for other simulation sessions to use. Conversely, a new simulation session may be restarted from a previously saved state, in which case, maintenance interface 74 retrieves a previously stored architectural state of the emulation model from a disk file and updates emulation modeler 54 with necessary architecturally visible data for DUS 48 to be updated. Emulation modeler 54 then updates interface 20 with the stored data on user interface screen.

Operation—FIGS. 1, 2A, 2B, and 3

Referring back to FIG. 1, next we look at how a graphical user interface is used to provide an ICE-like environment for the emulation model. As we saw earlier, debug and user interface 20 is spawned by maintenance interface 74 upon beginning of a new simulation session, for each selected model in simulation environment 26. Typical examples of debug and user interface screens are shown in FIGS. 2A and 2B. FIG. 2A provides a debug and user interface for a Dynamic Random Access Memory (DRAM) device. Some of the exemplary debug features are the ability to query data at any address, the ability to set data at any address, setting breakpoints on any simulated access address or data, creation of expressions using debug conditions described above and subsequent breakpoint facility with such expressions. Loading of data files into memory is another feature that can be provided to the user. FIG. 2B shows a possible debug and user interface scenario for a microprocessor emulation model.

FIG. 3 details how debug and user interface 20 is controlled. The means to control a model specific debug interface per instance of model Type A is handled in model Type A control (Instance 1) 56. (Manipulation of the GUI screen is now quite simple with scores of software packages on the market geared for setting up generic GUI screen and their manipulations, e.g. VisuaLab from IOtech Inc., Cleveland, Ohio) A user interface for other instances of model Type A are controlled through similar software routines outlined as controls 58 and 60.

Looking at control 56 in particular, these are a set of software routines which manipulate graphical user interface (GUI) for emulation model Type A instance 1. Certain field definitions are common to all the models, while many are typical to the model Type A. All the instance specific field data is obtained from modeler 54 upon initialization and during runtime. Control 56 maintains its own data structure to locally manipulate the fields. All query and change requests are packaged into a command packet and sent over to a model Type A interface 64.

All instances (model representations with similar functionality but unique data to each) of model Type A submit their emulation requests to interface 64. Interface 64 acts as a bidirectional software buffer. Responses and new updates are received by interface 64 from emulation modeler 54. Interface 64 then determines which instance of model Type A needs to get the response for screen update and passes the response to one of controls 56, 58, or 60 as shown in FIG. 3.

Other model types are supported as well. An example shown here is a model Type N control 62. Control 62 (shown with all related instances) works with a model Type N interface 66 to update the relevant GUI information for all emulation models of Type N. All the interfaces, such as interfaces 64 and 66 in turn communicate with the bidirectional software buffer called emulation GUI network interface 68. Network interface 68 uses GUI communication channel 22 (common Remote Process Communication, RPC under UNIX) to remotely communicate with emulation modeler 54 over remote access port 24, e.g., network media such as ethernet.

Operation—FIGS. 1 and 2A

In a simple scenario for a DRAM emulation model, a few options that can be made available to the user are the control and visibility into the storage area of the DRAM. As depicted in FIG. 2A, a user can select to work with any instance of a DRAM by setting the INSTANCE field. A menu based selection (drop-down) list is made available to pick an instance to work with from all simulated instances. The RADIX to work with can optionally be set next. Most user selected fields have drop-down selections and where appropriate the selection can be keyed in directly by the user from the keyboard. A mouse or similar pointing device will provide the click and select functions on the menu.

If the user simply wants to browse the data locations at any address, user selects the screen button for Breakpoint/Query. The Query option ghosts out the Breakpoint feature. (And vice versa.) Next the user keys in the Desired Address value in the ADDRESS field. When the Query feature is selected, interface 20 (FIG. 1) submits a command with the relevant information to command and data interpreter and router 34 which informs user request and default functional state generator 42 about the request. For the case of a DRAM, it will be a Read access to the user's selected location.

Generator 42 in turn provides the necessary stimuli sequence to satisfy the Read request and submits it to device control 50, which finally controls device under simulation 48. DUS 48 brings the DRAM out of quiescent state, performs the Read operation, and passes the Real Stored Data back to user interface 20. The returned Data is now displayed in the corresponding DATA field on the screen.

If the user wants to update the Data stored at another desired Address, the user keys in the value for the Data and the Address and upon hitting a return, this request is sent as described earlier to device control 50. This time around, DUS 48 (DRAM) is submitted a Write cycle after being brought out of the quiescent state. Now any subsequent Read access to this DRAM location from within the simulation will provide this updated new Data.

A powerful breakpoint facility is provided to the user with the DRAM emulation model during simulation of the design. A user can select a combination (or several such sets) of Address and Data values to match. Upon detecting such combination to be true, the simulation will be made to stop for further analysis by the user. The user may even select an Iteration of such matches (via COUNT field) before which the simulation will be made to stop. The breakpoint facility is extended even further to allow the user to set a breakpoint on a mix of previously selected Address/Data sets in the form of an expression. An example of a expression using boolean logic is D1 'boolean and' D2 'boolean or' D3, where D1, D2, D3 etc., are previously selected Address/Data sets. A set of Expressions can be enabled by the user to selectively narrow down the design verification on the simulator. These features are analogous to ones provided in ICE products but were yet not possible up until now with the simulated design analysis except with possible use of software models.

Operation—FIGS. 1 and 2B

Next, a more sophisticated emulation debug and user interface is presented on FIG. 2B. This interface will be atypical for complex VLSI devices. For each device type, the user will be provided with an information panel which will represent all architecturally visible registers and status. (Internal registers and status to the device that the user's design can functionally access within the VLSI device in the normal course of usage, i.e. manufacturer defined functional accesses as published in the data book for the VLSI device.)

The given example is that for a microprocessor, specifically the AM386 device (as supplied by Advanced Micro Devices, Santa Clara, Calif.). The most useful information that a designer wants at hand during software instruction debug on simulation is the Instruction Pointer. The user can monitor its progression by Enabling the Update option. When breakpoint facility is selected for the Instruction Pointer, the update is automatically disabled. The user can then type in the breakpoint address or select a Symbol (from source code representing an address within the program) from the available Symbol Table. A breakpoint can be set to Hit after an iterative Count. A whole range of architecturally visible registers can be selected by the user based on user's debug needs. The interface allows the viewing of all 'Status Bits' of the microprocessor. Any status bit that is programmable can also be modified from the user debug screen. Finally, a Run Time display is provided which shows the status of the microprocessor as it is executed within the simulator. Status Information that is made available is the Interrupt (Maskable and Non Maskable), Halt Mode, Double Faults, Real or Protected Modes of operation, and the current Bus Cycles being executed.

The debug screen is only a representative of what the various information can be made available to the user of the emulation model for a microprocessor. Useful variations and additions to the information can easily be incorporated based on user needs.

The information between simulation environment 26, user interface 20 and emulation modeler 54 passes over remote access port 24 as shown on FIG. 1. This can be any of the standard communication media on the market such as ethernet, PCI, SBUS, FDDI etc.

Operation—FIGS. 1 and 5

FIG. 5 shows details of command and data interpreter and router 34 of FIG. 1. Interpreter and router 34 uses remote procedure calls (RPC on Unix) over command and data channel 32 to provide remote accesses to emulation modeler 54 to the design team over a network.

Command and data network interface 78 acts as a bidirectional software buffer to direct the various command and data packets. On one end it interfaces with the various GUI displays of various models on user interface 20 and corresponding simulation shell models on environment 26 and on the other it interfaces to emulation modeler 54. Interface 78 also determines which type of data or command packets are received: functional simulation related, maintenance related, or user and debug emulation related. Three software queues are supported to hold the three packet types. Interface 78 takes a packet from each queue and feeds the packet to one of the routers 80, 82, or 84 respectively using inter process communication routines (IPC under UNIX).

Simulation run-time information router 80 queues packets which are related to simulation updates. All the accesses to the emulation model during a simulation run, are submitted here. This is a bidirectional first-in-first-out (FIFO) software buffer to transfer simulation data and command packets back and forth. On one end it gets the simulation data (for all Model Types and related Instances) from external interface 78 and on the other, it interfaces with device control 50 using simulation command and data channel 36 (IPC Unix routines).

Emulation modeler related information router 82 is a set of routines which formats and packages command and data packets relating to emulation setup and maintenance. Router 82 sends packets to device control 50 over maintenance command and data channel 52 (IPC Unix routines). The responses are queued and sent back to interface 78. A FIFO structure is maintained to handle the packet traffic among several design simulation sessions.

Debug run-time information router 84 is the bidirectional data and command packet (FIFO) buffer for routing all user requests to view and change data for a register or status of a model (instances 1 to n). It also passes the breakpoint set commands to the device control 50. This router 84 forwards the data and command packets over emulation command and data channel 38 (IPC Unix routines) to device control 50. All responses from control 50 for debug screen updates and breakpoint set updates are queued and sent back to interface 78 by this router 84.

Operation—FIGS. 1, 4, and 6

Simulation specific functional accesses are handled by simulation specific functional state generator 40 on FIG. 1. State generator 40 shows how each instance of a model (and all other model types and related instances) keeps track of its functional simulation state during a simulation session. Generator 40 takes the data packets sent by simulation environment 26 and decodes what architectural state change needs to be effected. Generator 40 then gathers the necessary pin-change information data and stimulus to make a functional access possible and sends out the stimulus set to device control 50. Generator 40 then takes responses from device control 50 and routes it back to simulation environment 26.

FIG. 6 shows the details of simulation specific functional state generator 40. Upon power-on, beginning or stopping or ending of a simulation session, restarting of a suspended simulation session, setup 85 identifies the all instances of all model types that need to be supported. Accordingly setup 85 spawns the various software buffers and state machine interpreters. For simplicity sake, we will devote the discussion to one instance of one model type.

Selection and response router 86 receives the simulation data for all the emulation model types supported (and all related instances) over channel 36. Router 86 is a bidirectional FIFO buffer. The information packet coming from simulation environment 26 is identified by router 86 to belong to one model type and instance and accordingly passed over to a state machine identifier process unique to a model type and instance. This is represented by emulation model state-machine interpreters 88, 90 etc.

These interpreters 88, 90 etc. are spawned and retired by setup 85 described above. All architecturally visible states and related access sequences are maintained by interpreter 88 for a given emulation model type-instance. Based on the new functional state update request, the state machine list is referred to determine the current architectural change as requested by shell model 72B and interface 70. A corresponding simulation pin-change sequence is looked up in a local data structure within a state-machine interpreter 88 and formatted into a pin-change set and passed on to device control 50. All simulation requests to functionally access the device status are tracked locally in the generator 88, 90 etc. for a corresponding response from the device control 50.

All simulation pin-change sets from the various interpreter 88, 90 etc. are collected together by simulation 'DUS' access request and response router 92. This is a bidirectional software FIFO buffer to pass simulation pin-change sets from simulator end to device control 50 via simulation state machine channel 44 (IPC Unix routines). The responses from device control 50 are received via channel 44 by router 92. Router 92 then sends the response packet to corresponding state-machine interpreter 88, 90, etc. The response is matched to the pending simulation state change request and is then packaged for forwarding it to corresponding host simulator 72 and related shell model 72B, through router 86 and channel 36.

While simulator 72 proceeds with the simulation session, DUS 48 is kept in a quiescent state by providing it with a default state. In a DRAM, this would be REFRESH CYCLEs. In a microprocessor, this is keeping the processor in a HOLD or a HALT state. In a static device, there may not be a need for a special default state. The default state conditions are specific to an emulation model type and will be enclosed in the state machine information list which will be used to access an emulator model for simulation and emulation. This is described in detail below.

Operation—FIGS. 1 and 7

FIG. 7 shows the other half of the access to DUS 48. This provision is what makes an emulation model completely different from a hardware model. It is this feature which provides powerful debug functionality to the emulation model within simulation which is deemed very useful for system level co-design using simulation tools.

Emulation specific functional accesses are handled by user request and default functional state generator 42 on FIG. 1. State generator 42 shows how each instance of a model (and all other model types and related instances) keeps track of its user requested emulation state during a simulation session. Generator 42 takes the data packets sent by user interface 20 and decodes what architectural state change needs to be effected. Generator 42 then gathers the necessary pin-change information data and stimulus to make a functional access possible and sends out the stimulus set to device control 50. Generator 42 then takes responses from device control 50 and routes it back to user interface 20.

FIG. 7 shows the details of state generator 42. Upon power-on, beginning or stopping or ending of a simulation session, restarting of a suspended simulation session, setup 93 identifies the all instances of all model types that need to be supported. Accordingly setup 93 spawns the various software buffers and emulation model debug access interpreters. For simplicity sake, we will devote the discussion to one instance of one model type.

The user request to view or to modify any internal (architecturally visible) registers and/or status is first received by emulation model instance selection and response router 94 via emulation command and data channel 38 (IPC Unix routines). Router 94 is similar in functionality to Router 86 in FIG. 6. It determines which model type and instance needs to be accessed for the user request generated by user interface 20. The request is accordingly farmed out to emulation model 'default/debug access' generator 96, 98, etc. Router 94 acts as a bidirectional software FIFO buffer to receive the requests on one hand from the user and on the other hand it also sends back the responses received from DUS 48 to workstation 15 where the DEBUG display is updated on interface 20.

Generator 96 receives the user's debug related requests from router 94 for emulation model type A (and all instances of type A). Based upon the request type, a state machine lookup table is referenced and an emulation pin-change set is generated to access DUS 48. This information is packaged into a packet and sent over to control 50 via status 'update/view' request and response router 100. A breakpoint command is also sent over to device control 50. Generator 96 also has the default pin-change set and this information is passed onto DUS 48 upon a simulation session initialization. It is this default pin-change set which is used to keep DUS 48 in the quiescent state by control 50. All user requests to update and view device status and breakpoint commands are tracked locally in the generator 96 for retiring when a corresponding response is received from the device control 50.

Generator 98 is similar to generator 96 and is used for handling all emulation model of type B and related instances. Similar other blocks will be invoked based upon the user configuration of model type selection within a simulation session.

Router 100 is also a bidirectional software FIFO buffer which takes the emulation and default pin-change sets and submits them to DUS 48 via emulation and default state machine channel 46 (IPC Unix routines). It also receives the responses back from DUS 48 and passes them back to respective default/debug access generators 96, 98, etc. These generators package the response for forwarding it to corresponding user interface 20. These responses are matched with the pending request and are routed back via router 94 and channel 38 and ultimately to user interface 20 where the graphical user interface is updated.

If during simulation, a breakpoint condition is hit on DUS 48, this information is sent as a new update command from control 50 to user interface 20 through the various routers and communication channels described above. In parallel, the breakpoint information is also tagged with the pending simulation pin-change response from device control 50 to generator 40. This breakpoint information is then ultimately passed (via previously described channels) to the shell model 72B which stops the simulator 72.

Operation—FIGS. 1, 4 and 8

The actual VLSI devices are controlled by device control 50 of FIG. 1. This is the heart of emulation modeler 54. The details of which are shown in FIG. 8. Device under simulation 48 is represented here as a set of personality modules 108, 110, etc. for various emulation model types supported. For sake of simplicity, only one personality module 108 (device control specific to a VLSI device being modeled) will be referred during the discussion.

There are three distinct types of accesses to personality module 108. First is related to maintenance, setup and control. The second is for controlling simulation related accesses. The third is the default and debug (or emulation) related accesses. Three sub blocks are defined to provide routing and control for these access types.

The first access type is the basic maintenance and setting up of personality module 108 to carry out an emulation session. This task is governed by maintenance, setup and control router 104. Some of the maintenance and control tasks provided by router 104 are as follows: 'Simulation start/stop', 'Emulation model list supported', 'Running of Diagnostics', 'Creating a new instance for a simulation session', 'Saving/Restoring a simulation session', etc. Each of these tasks are common functions that are supported by most commercial simulators in the market. Local data structures are maintained by control router 104 to keep track of the various pending commands for various simulation sessions for all the instances of all the models.

The system request originated by maintenance interface 74 is routed via the various channels as described earlier to router 104 via maintenance command/data channel 52 (IPC Unix routines). All such system requests are buffered by router 104 and the operation as desired is submitted to personality module 108 using channel for emulation modeler system request 114 (IPC Unix routines). Upon completion of the operation, personality module 108 sends the response back on channel 114 to router 104 which is sent back to maintenance interface 74.

The second access type to DUS 48 is related to providing simulation updates to and from personality module 108. This is defined in simulation access vector process/response router 102. Router 102 receives a simulation pin-change set for a specific model type-instance over simulation state machine channel 44 (IPC Unix routines), and farms it out to the corresponding actual VLSI personality module. As there can be several model type-instances supported, router 102 provides the simulation pin-change sets for all model type-instances. Router 102 acts as a bidirectional software FIFO buffer and router. The pin-change set request is sent over channel for simulation access request 112 to a specific personality module. The responses from the personality module are passed back over channel 112 to router 102 which sends it back to simulator 72 via channel 44, and other intermediate routers and channels described earlier.

The third access type to DUS 48 is the model debug/update (and default access) to keep the DUS 48 architecturally accessible to the user. This is controlled by default and debug access for vector process/response router 106. Similar to router 102, router 106 also acts as a bidirectional software FIFO buffer. The user request to update an architecturally visible register or status is received by block 106 as a emulation pin-change set over emulation and default state machine channel 46 (IPC Unix routines). This user request is submitted to personality module 108 using debug access channel 116 (IPC Unix routines). As there can be several model type-instances supported, router 106 provides the pin-change sets for all model type-instances. The response from the personality module 108 is passed back over channel 116 to router 106 which sends it back to the user interface 20 via channel 46, and other intermediate routers and channels described earlier.

Operation—FIGS. 1, 8, 9A and 9B

There are as many personality modules as emulation models types supported. These are defined by personality modules 108, 110, etc. Each personality module can represent one or many instances for a particular model type. The final decision is dependant on simulation user's needs and are not limited to technology described. The details of the workings of a personality module 108 are shown in FIG. 9A.

The three access types to a VLSI device described earlier are now submitted to reference element 122 by arbitration and synchronization control circuit 118. Channels 112, 114, and 116 (IPC Unix routines) are used to receive the access for simulation, maintenance, and debug/default respectively.

Control circuit 118 uses the flowchart depicted in FIG. 9B to determine the sequence for each access to reference element 122.

On Power-On-Reset, the maintenance mode is entered, where circuit 118 sets up internal architectural state table for each instance that is requested per simulation session. A simulation session is next setup where all simulation related parameters are setup. This will include items such as simulation time resolution, instances supported within a simulation session etc. Finally, user interface parameters that need to be accessed are setup. Each request is from hereon decoded and necessary actions taken as are shown on the flowchart of FIG. 9B.

The pin-change sets from simulation or debug/user interface are sent to reference element 122 via hardware buffers and latches (Driving) 120. Data signals are sent along with control signals by control circuit 118 to drive buffers 120. The response is read back from reference element 122 via another set of hardware buffers and latches (Receiving) 124. Again control circuit 118 sends control signals to the buffers 124 to capture the data signals coming in from reference element 122. Next, necessary architecturally visible state table update is carried out within control circuit 118 as shown in the flowchart and the responses sent back to the requestor via the channels 112, 114, and 116.

All changes to reference element 122 are carried out by personality module 108. Its architecturally valid state is kept current only within control circuit 118, such that the information is unique and accurate even when two accesses are applied to reference element 122, one from the simulator and the other from the user interface.

For keeping the device in a quiescent state and logically functioning correctly, hardware interrupt driven access allocation is carried out within the circuit 118. Case in point is a DRAM, where it is necessary to insure that all the locations of the DRAM remain refreshed. A hardware interrupt is generated with a predetermined frequency within the control circuit 118 which forces a refresh cycle in between any simulation or user access cycle. For other VLSI devices, other default pin-change set will have to be submitted to keep the device in its quiescent state.

At each simulation and emulation access to reference element 122, breakpoint conditions are checked for setting off (being asserted). If this is true, then a breakpoint message is sent to user interface 20 and to simulator environment 26, allowing the user complete control over the design verification on a simulated system.

Control circuit 118 keeps track of various instances for each simulation session in progress. The architecture state data for all given instance for a given simulation session are kept current within circuit 118. A user has complete control over start, stop, save and restoring of simulation sessions. Accordingly to user requests, maintenance interface 74 provides the command for simulation session control. Circuit 118 provides the lowest level control for keeping track of the various instances and their architectural state data. These functions are analogous to maintenance of state data for software models in a traditional simulator.

Conclusion, Ramifications, and Scope

Thus the reader will see that emulation modeling apparatus 54 provides a very useful analysis tool for complex if-then-else scenarios for digital designers using simulation tools along with complex VLSI devices. It also provides an early means to integrate system software along with system hardware on simulated designs using a variety of real VLSI devices. This integration means is provided without any limitations to simulation duration which were a major drawback in the prior art. Also the method of simulating a VLSI device more efficient than all prior methods of modeling VLSI devices or systems. Finally, actual complexity of the real VLSI device is fully utilized while model development effort is minimized as opposed to that for a full function software model.

Furthermore, the emulation modeling apparatus has the following additional advantages:

1. Device control 50 can be adapted to provide means to support a plurality of reference elements as a library of emulation models. Each reference element can be mounted in a backplane arrangement, such as, PCI bus (as defined by Intel Corp., Santa Clara, Calif.) where each reference element is disposed on each PCI board.
2. Reference element 122 can easily be adapted to provide an interface to a 'Packet Transfer Bus', such as PCI, SBUS (MBUS or XBUS from SUN Microsystems, Mountain View, Calif.), FUTURE BUS (IEEE standard) etc. This is possible because the emulation model can accumulate a packet transfer request from the simulator (in simulation time ticks) and later submit a 'real time' request to the BUS. The response from real devices on the BUS are in turn picked up in real time and then farmed back to the simulation hardware in simulation time ticks.
3. Reference element 122 can easily be adapted to provide an interface to a programmable emulation subsystem as marketed by companies such as Aptix Corporation, San Jose, Calif. or Quickturn Design Systems Corp., Mountain View, Calif., thereby enhancing the usefulness of these verification tools as a simulated subsystem instead of just an emulation subsystem.
4. One VLSI device can be used to repeatedly emulate multiple instances for the given VLSI device. The trade-off here is in hardware cost versus emulation response time. If the user has only one VLSI device type with very few instances, the overall performance may still be limited from the software simulator used to instantiate the emulation models.
5. A fault-emulation/simulation model may be provided with the scheme as discussed in item 4.

While the preferred embodiment of the emulation modeler is described, other embodiments (which accomplish the synchronization of simulator, Graphical User Interface, and acquiescing of VLSI devices to be emulated within the simulator via the use of hardware and software) will be obvious in view of the above description.

While my above description contains many specificities, these should not be construed as limitations on the scope of the invention, but rather as an exemplification of one preferred embodiment thereof. Many other variations are possible, for example:

The complete simulation environment with the emulation modeler along with the debug user interface can be integrated into a low-cost design station. In a most basic case, a simple emulation modeler without a user interface can also be provided to provide modeling support for complex devices or systems where there are no upper limits in simulation duration. This provides a fast and cheap modeling solution to current modeling alternatives supported in the market.

The simulation environment and the emulation modeler can be set up to work remotely, while only the debug user interface is presented to the user on a local X-terminal. This setup is ideal for design teams who want to share expensive resources.

The emulation modeler can be interfaced with a variety of simulator types supported in the commercial marketplace such as those supporting event-driven scheduling algorithm or those supporting clock cycle based scheduling algorithm.

The emulation modeler can be interfaced with a variety of commercial software language debuggers supporting powerful co-simulation debugging environment.

Although most of the sections of the emulation modeler are shown to be implemented in software, a significant portion of the emulation modeler can be developed as firmware or even hardware which will provide a very fast and efficient simulation and emulation modeling environment.

The emulation modeler can also be integrated with a hardware simulator (hardware accelerators sold by IKOS Systems, Cupertino, Calif. or Zycad Corp., Fremont, Calif.). This will provide a very fast albeit little more expensive emulation modeling apparatus.

Thus, the scope of the invention should be determined not by the embodiment illustrated, but by the appended claims and their legal equivalents.

What is claimed is:

1. A method of emulating a complex circuit in a simulated system on a logic simulator with no upper simulation time limit, comprising the following steps:
   a) providing a simulator interface to control and accumulate any functionally complete architecturally visible update from said logic simulator to said complex circuit,
   b) providing a model debug and user interface to manipulate any architecturally visible registers and status within said complex circuit,
   c) providing a control mechanism to keep said complex circuit in an architecturally unaltered state by providing necessary clocks and data signals to keep said complex circuit operating in a quiescent state,
   d) providing a control and routing mechanism to accept and to submit simulator updates and user interface debug updates to said complex circuit after bringing said complex circuit out of said quiescent state,
   e) providing a control and routing mechanism for monitoring responses from said complex circuit, putting said complex circuit back into quiescent state, and routing said responses to said logic simulator and to said model debug and user interface, whereby the complex circuit is continually emulated within the simulated system with the ability to view or to alter or to set breakpoints on architecturally visible internal state of the complex circuit so as to provide a powerful debugging environment prior to building a real prototype of the system under development.

2. The method of claim 1, further including:
   a) providing an arrangement for representing a plurality of instances for said complex circuit,
   b) providing a plurality of model debug and user interfaces for representing a plurality of instances of said complex circuit, and
   c) providing simulation and emulation control and routing mechanism for a plurality of instances of said complex circuit.

3. The method of claim 1, further including:
   a) providing an arrangement for representing a plurality of instances for a plurality of different complex circuits,
   b) providing a plurality of model debug and user interfaces for representing a plurality of instances of a plurality of complex circuits, and c) providing simulation and emulation control and routing mechanism for a plurality of instances of a plurality of different complex circuits.

4. The method of claim 1, further providing an arrangement for representing a plurality of instances of a plurality of different complex circuits within a plurality of simulation sessions representing an emulation support using a plurality of model debug and user interfaces and providing emulation and simulation debugging for a plurality of said instances of a plurality of said different complex circuits within a plurality of said different simulation sessions.

5. The method of claim 4 wherein said complex circuits represent a plurality of predetermined and programmable circuits and systems.

6. A simulation model for emulating a complex circuit in a simulated system on a logic simulator with no upper simulation time limit, comprising:

a) a simulation means for representing said complex circuit consisting of a very large scale integrated circuit device or an electronic system within said simulated system represented on said logic simulator, b) a debugging means for viewing and altering an architecturally visible register or status within said complex circuit on a model debug and user interface, c) a maintenance and controlling means for creating a simulation session representing said simulated system for allowing said complex circuit to communicate with said logic simulator to start, pause, advance, or stop said simulation session, d) a simulation interaction means for repeatedly accepting stimuli from said logic simulator and for responding locally with new stimuli to said logic simulator representing modeling activities to and from said complex circuit until a functional tuple is accumulated representing a predetermined functional pattern or a sequence of functional patterns of stimuli along with simulation specific functional data representing one complete architecturally visible access to said complex circuit's architecturally visible internal registers, e) an emulation means for generating emulation breakpoint commands and to generate architecturally visible emulation tuples representing a predetermined functional pattern or sequence of functional patterns of stimuli along with user specified debug data for accessing said complex circuit's architecturally visible internal registers, f) an acquiescing means for keeping the internal state of said complex circuit current by submitting to said complex circuit an acquiesce tuple representing a predetermined pattern or sequence of patterns of stimuli, g) a controlling means for submitting said acquiesce tuples or said functional tuples or said emulation tuples or said emulation breakpoint commands or said maintenance commands to said complex circuit to continually keep said complex circuit in an architecturally correct operational internal state, h) a simulation routing means for accepting a simulation functional response or an emulation breakpoint response or a simulation session setup and maintenance response from said complex circuit and routing said accepted response back to said logic simulator for starting, pausing, advancing, or stopping of said simulation session, i) an emulation routing means for accepting said simulation response or said emulation and breakpoint response from said complex circuit and routing said accepted response back to said model debug and user interface for emulation debug or breakpoint update, whereby the complex circuit is continually emulated within the simulated system with the ability to view or to alter or to set breakpoints on architecturally visible internal state of the complex circuit so as to provide a powerful debugging environment prior to building a real prototype of the system under development.

7. The simulation model of claim 6, further including:

a) simulation means to represent a plurality of instances for said complex circuit within said logic simulator, b) said model debug and user interface providing emulation means for representing a plurality of instances of said complex circuit, and c) control means providing simulation and emulation support for a plurality of instances of said complex circuit.

8. The simulation model of claim 6, further including:

a) simulation means to represent a plurality of instances for a plurality of different complex circuits within said logic simulator, b) said model debug and user interface providing emulation means for representing a plurality of instances of a plurality of different complex circuits, and c) control means providing simulation and emulation support for a plurality of instances of a plurality of said different complex circuits.

9. The simulation model of claim 6, further including simulation means to represent a plurality of instances of a plurality of different complex circuits within a plurality of simulation sessions representing emulation support using a plurality of model debug and user interfaces and providing emulation and simulation debugging for a plurality of said instances of a plurality of said different complex circuits within a plurality of said different simulation sessions.

10. The simulation model of claim 9 wherein said complex circuits represent a plurality of predetermined and programmable circuits and systems.

11. A simulation model for emulating a complex circuit in a simulated system on a logic simulator with no upper simulation time limit, comprising:

a) a simulation means for representing said complex circuit consisting of a very large scale integrated circuit device or an electronic system within said simulated system on said logic simulator, b) a debugging means for enabling a user to view or to alter an architecturally visible register within said complex circuit, c) a maintenance interface means for providing maintenance and control for setting up a simulation session involving said complex circuit to communicate with a software shell model and said logic simulator along with a model debug and user interface to start, pause, advance, or stop said simulation session on said logic simulator, d) said software shell model providing simulation interaction means for repeatedly accepting stimuli from said logic simulator and for responding locally with new stimuli to said logic simulator representing modeling activities to and from said complex circuit until a functional tuple is accumulated representing a predetermined functional pattern or sequence of functional patterns of stimuli along with simulation specific functional data representing one complete architecturally visible access to said complex circuit's architecturally visible internal registers, e) said model debug and user interface further providing emulation means for generating emulation breakpoint commands and for generating an architecturally visible emulation tuple representing a predetermined functional pattern or sequence of functional patterns of stimuli along with simulation specific debug data for accessing said complex circuit's architecturally visible internal registers, f) a command and data interpreter and router providing routing means for accepting any of said functional tuples from said shell model and said emulation tuples and said breakpoint commands from said model debug and user interface and maintenance and setup commands from said maintenance interface, g) said command and data interpreter and router further providing buffering means for passing on of said functional tuples to a simulation specific functional state generator and said emulation tuples and said breakpoint commands to a user request and default functional state generator and said maintenance and setup commands to a device control, h) said simulation specific functional state generator providing control means for accumulating said functional tuples and submitting corresponding predetermined functional pattern or a sequence of functional patterns of stimuli and simulation dependent data to said device control, i) said user request and default functional generator providing control means for accumulating said emulation tuples and submitting corresponding predetermined functional pattern or a sequence of functional patterns of stimuli and user supplied emulation data to said device control, j) said user request and default functional generator further providing control means for accumulating said breakpoint commands and submitting these to said device control, k) said device control providing buffering means for accepting any of said functional tuples or said emulation tuples or said emulation breakpoint commands or said maintenance commands to submit these to a personality module, l) said personality module connected to said complex circuit via input and output buffers by a plurality of signal paths, m) said personality module further providing acquiesce means for keeping the internal state of said circuit current by controlling said input and output buffers to submit to said complex circuit an acquiesce tuple representing a predetermined pattern or a sequence of patterns of stimuli, n) said personality module further providing control means for accepting command and data from said acquiesce tuples or said functional tuples or said emulation tuples or said emulation breakpoint commands or said maintenance commands and to submit these to said complex circuit to continually keep said complex circuit in a correct architecturally operational state, o) said personality module further providing buffering and routing means for registering a simulation functional response or an emulation breakpoint response or maintenance setup response from said complex circuit and submitting said response to said device control, p) said device control further providing buffering means for passing on said simulation and emulation responses to said simulation specific functional state generator and said user request and default functional state generator and said command and data interpreter and router, q) said simulation specific functional state generator further providing buffering means for routing said simulation functional responses and said emulation breakpoint responses from said device control to said command and data interpreter and router and said software shell model for pausing, or advancing said logic simulator, r) said user request and default functional state generator further providing buffering means for routing said simulation response and said emulation and breakpoint responses from said device control to said command and data interpreter and router and said model debug and user interface, s) said command and data interpreter and router providing buffering means for routing said simulation setup and maintenance command response from said device control to said maintenance interface for starting or controlling or stopping said logic simulator, whereby the complex circuit is continually emulated within the simulated system with the ability to view or to alter or to set breakpoints on architecturally visible internal state of the complex circuit so as to provide a powerful debugging environment prior to building a real prototype of the system under development.

12. The simulation model of claim 11, further including:

a) said maintenance interface further providing control means for representing a plurality of instances of said complex circuit within said simulation session with the use of a plurality of said software shell models, b) said model debug and user interface further providing emulation means for representing a plurality of instances of said complex circuit as setup by said maintenance interface within said simulation session, and c) said device control further providing control means for supporting a plurality of personality modules representing a plurality of instances of said complex circuit as setup by said maintenance interface within said simulation session and providing emulation and simulation support for a plurality of said personality modules.

13. The simulation model of claim 11, further including:

a) said maintenance interface further providing control means for representing a plurality of instances of a plurality of different complex circuits within said simulation session with the use of a plurality of said software shell models, b) said model debug and user interface further providing emulation means for representing a plurality of instances of a plurality of said different complex circuits as setup by said maintenance interface within said simulation session, and c) said device control further providing control means for supporting a plurality of personality modules representing a plurality of instances of a plurality of said complex different circuits as setup by said maintenance interface within said simulation session and providing emulation and simulation support for a plurality of said personality modules.

14. The simulation model of claim 11, further including a plurality of device control providing control means for supporting a plurality of personality modules for controlling a plurality of instances of a plurality of different complex circuits as setup by a plurality of maintenance interfaces within a plurality of simulation sessions representing emulation support using a plurality of model debug and user interfaces and providing emulation and simulation debugging for a plurality of said instances of a plurality of said different complex circuits within a plurality of said different simulation sessions.

15. The simulation model of claim 14 wherein said complex circuits represent a plurality of predetermined and programmable circuits and systems.

* * * * *